(12) United States Patent
Kira et al.

(10) Patent No.: US 10,712,891 B2
(45) Date of Patent: Jul. 14, 2020

(54) WIRING BOARD, DISPLAY DEVICE, AND METHOD OF PRODUCING WIRING BOARD

(71) Applicant: Sharp Kabushiki Kaisha, Sakai, Osaka (JP)

(72) Inventors: Takatoshi Kira, Sakai (JP); Mikihiro Noma, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/398,353

(22) Filed: Apr. 30, 2019

(65) Prior Publication Data
US 2019/0346973 A1 Nov. 14, 2019

(30) Foreign Application Priority Data

May 10, 2018 (JP) .................................. 2018-091566

(51) Int. Cl.
| | |
|---|---|
| *G06F 3/044* | (2006.01) |
| *H01L 27/32* | (2006.01) |
| *H01L 51/00* | (2006.01) |
| *H01L 51/52* | (2006.01) |

(52) U.S. Cl.
CPC .......... *G06F 3/0446* (2019.05); *H01L 27/323* (2013.01); *H01L 27/3244* (2013.01); *H01L 51/0097* (2013.01); *H01L 51/5281* (2013.01); *G06F 2203/04102* (2013.01); *G06F 2203/04103* (2013.01); *G06F 2203/04112* (2013.01); *H01L 2251/5338* (2013.01)

(58) Field of Classification Search
CPC ......... G06F 3/0446; G06F 2203/04103; G06F 2203/04112; G06F 3/04164; G06F 3/044; G06F 3/041; G06F 3/0412; G06F 2203/04111; G06F 2203/04102; H01L 27/323
See application file for complete search history.

(56) References Cited

U.S. PATENT DOCUMENTS

| | | | |
|---|---|---|---|
| 2014/0218636 A1 | 8/2014 | Gao | |
| 2016/0026315 A1* | 1/2016 | Choi | ...................... G06F 3/0414 345/174 |
| 2016/0132148 A1* | 5/2016 | Han | ....................... G06F 3/0412 345/174 |

FOREIGN PATENT DOCUMENTS

JP          2015-509255 A        3/2015

* cited by examiner

*Primary Examiner* — Koosha Sharifi-Tafreshi
(74) *Attorney, Agent, or Firm* — Keating & Bennett, LLP

(57) ABSTRACT

A wiring board includes a first imprint layer having a first groove, a first conductive layer in the first groove, a second imprint layer on the first imprint layer and having a second groove and a contact hole, a second conductive layer in the second groove and the contact hole, a first terminal side conductive part constituted by the second conductive layer and including a first terminal and disposed to partially overlap the contact hole, a first non-terminal side conductive part constituted by the first conductive layer and not including the first terminal and disposed to partially overlap the contact hole, a second terminal side conductive part constituted by the second conductive layer and including a second terminal, and a second non-terminal side conductive part constituted by the second conductive layer and not including the second terminal and joined to the second terminal side conductive part.

10 Claims, 14 Drawing Sheets

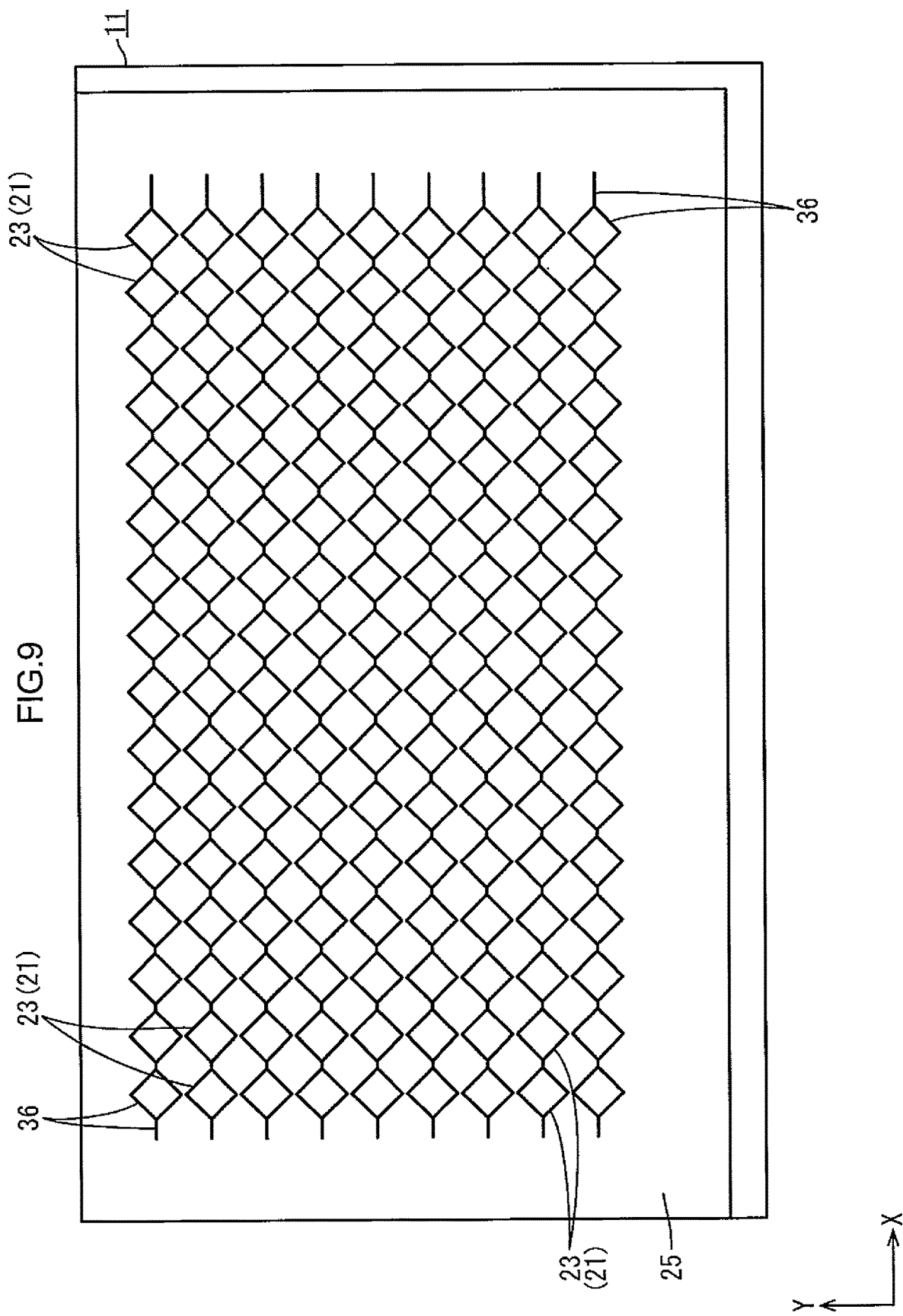

WIRING BOARD, DISPLAY DEVICE, AND METHOD OF PRODUCING WIRING BOARD

CROSS REFERENCE TO RELATED APPLICATION

This application claims priority from Japanese Patent Application No. 2018-091566 filed on May 10, 2018. The entire contents of the priority application are incorporated herein by reference.

TECHNICAL FIELD

The technology described herein relates to a wiring board, a display device, and a method of producing a wiring board.

BACKGROUND

Electronic devices such as tablet laptop computers and portable information terminals have recently been becoming mounted with touch panels (touch screen sensing modules) for the purpose of enhancing operability and usability. A known example of a touch panel is disclosed in Japanese Unexamined Patent Application Publication (Translation of PCT Application) No. 2015-509255. A touch screen sensing module disclosed in Japanese Unexamined Patent Application Publication (Translation of PCT Application) No. 2015-509255 includes a first base plate, a first conductive layer, a second base plate, a second conductive layer, and a support substrate. A first groove of a predetermined shape is defined on one side of the first base plate. The first conductive layer is shaped in conformance with the first groove, and the first conductive layer is accommodated in the first groove. A second groove of a predetermined shape is defined on one side of the second base plate. The second conductive layer is shaped in conformance with the second groove, and the second conductive layer is accommodated in the second groove. The first conductive layer and the second conductive layer are shaped in conformance with the first groove and the second groove, respectively. This eliminates the need for etching to obtain an electrode in forming a conductive layer, thus making it possible to avoid wasting materials and reduce costs.

In the touch screen sensing module disclosed in Japanese Unexamined Patent Application Publication (Translation of PCT Application) No. 2015-509255, a first electrode lead wire is formed in the same first groove as the first conductive layer, and a second lead wire is formed in the same second groove as the second conductive layer. That is, since the first electrode lead wire and the second electrode lead wire are placed on the first base plate and the second base plate, respectively, a design needs to be made with such consideration that the first electrode lead wire placed on a lower level is not covered by the second base plate placed on an upper level. For this reason, the ranges of placement of the first electrode lead wire and the second electrode lead wire tend to be so wide that a frame width is great. Further, the difference in level between the first electrode lead wire and the second electrode lead wire makes it difficult to mount an external component that is connected to the first electrode lead wire and the second electrode lead wire.

SUMMARY

The technology described herein was made in view of the above circumstances. An object is to achieve a narrower frame.

According to an aspect of the technology described herein, there is provided a wiring board including: a first imprint layer having a first groove formed by partially depressing a surface of the first imprint layer; a first conductive layer formed in the first groove; a second imprint layer stacked on the first imprint layer, the second imprint layer having a second groove formed by partially depressing a surface of the second imprint layer and a contact hole that communicates with at least a part of the second groove; a second conductive layer formed in the second groove and the contact hole; a first terminal side conductive part constituted by the second conductive layer and including a first terminal to which an external component is connected, the first terminal side conductive part being disposed to at least partially overlap the contact hole; a first non-terminal side conductive part that is constituted by the first conductive layer and does not include the first terminal, the first non-terminal side conductive part being disposed to at least partially overlap the contact hole; a second terminal side conductive part constituted by the second conductive layer and including a second terminal to which the external component is connected; and a second non-terminal side conductive part that is constituted by the second conductive layer and does not include the second terminal, the second non-terminal side conductive part being joined to the second terminal side conductive part.

In this way, the partially depressed first groove is formed in the surface of the first imprint layer, and the first conductive layer is formed in the first groove. The partially depressed second groove is formed in the surface of the second imprint layer, which is stacked on the first imprint layer, and the second conductive layer is formed in the second groove. The second imprint layer has the contact hole, bored therethrough, which communicates with at least apart of the second groove, and the second conductive layer is also formed in the contact hole. The wiring board has the first terminal and the second terminal, to each of which the external component is connected, and among these, the first terminal is included in the first terminal side conductive part, whereas the second terminal is included in the second terminal side conductive part. Moreover, the first terminal side conductive parts and the second terminal side conductive parts are both constituted by the second conductive layer; therefore, if a configuration in which a first terminal side conductive part and a second terminal side conductive part are constituted by different conductive layers is adopted, a design needs to be made with such consideration that the first terminal or second terminal placed on a lower level is not covered by the first imprint layer or second imprint layer placed on an upper level, and in comparison, such configuration is no longer needed, so that the ranges of placement of the first terminal side conductive part and the second terminal side conductive part can be narrowed. As a result, a narrower frame can be suitably achieved. In addition, the formation of a difference in level between the first terminal and the second terminal, which are both constituted by the second conductive layer, is avoided, so that it becomes easy to mount the external component, which is connected to the first terminal and the second terminal. Whereas the second terminal side conductive part constituted by the second conductive layer is joined to the second non-terminal side conductive part, constituted by the second conductive layer, that does not include the second terminal, the first terminal side conductive part constituted by the second conductive layer is connected through the contact hole to the first non-terminal side conductive part, constituted by the first conductive layer, that does not include the first terminal.

This achieves an electrically continuous connection between the first terminal side conductive part and the first non-terminal side conductive part, which are constituted by different conductive layers from each other.

The technology described herein makes it possible to achieve a narrower frame.

BRIEF DESCRIPTION OF THE DRAWINGS

FIG. 9 is a plan view showing a state where the first conductive layer has been formed through the first conductive layer forming step of the method for manufacturing a touch panel;

DETAILED DESCRIPTION

First Embodiment

A first embodiment is described with reference to FIGS. 1 to 14. The first embodiment describes an organic EL display device (display device) 10 equipped with a touch panel function, a touch panel (wiring board, position input device) 20 of the organic EL display device 10, and a method for manufacturing the touch panel 20. It should be noted that some of the drawings show an X axis, a Y axis, and a Z axis and are drawn so that the direction of each axis is an identical direction in each drawing. FIG. 2, FIGS. 5 to 8B, and FIGS. 10 to 13 provide a basis for a vertical direction and show the front side up and the back side down.

Figure 1:
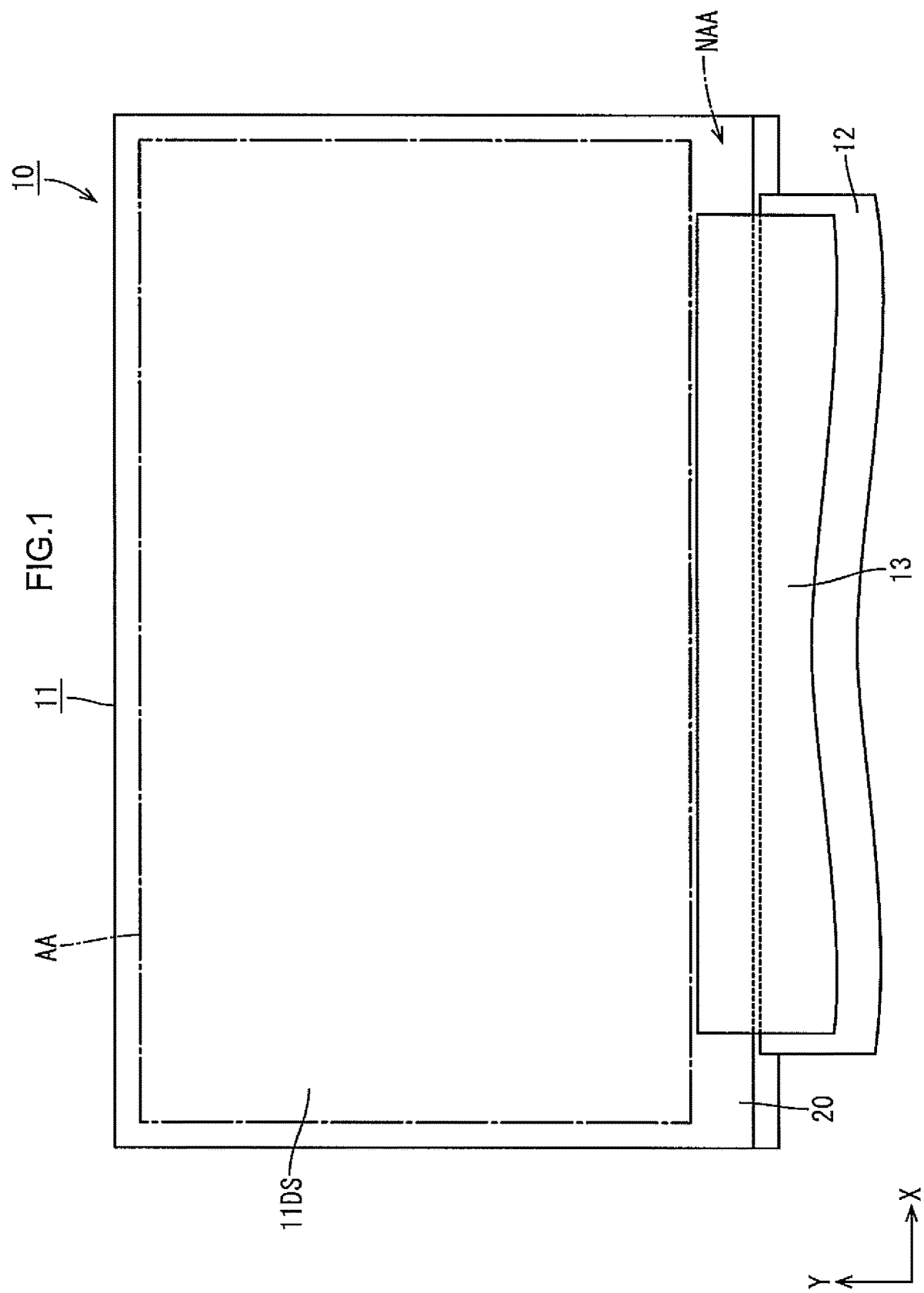
FIG. 1 is a plan view of an organic EL display device according to a first embodiment.
Figure 2:
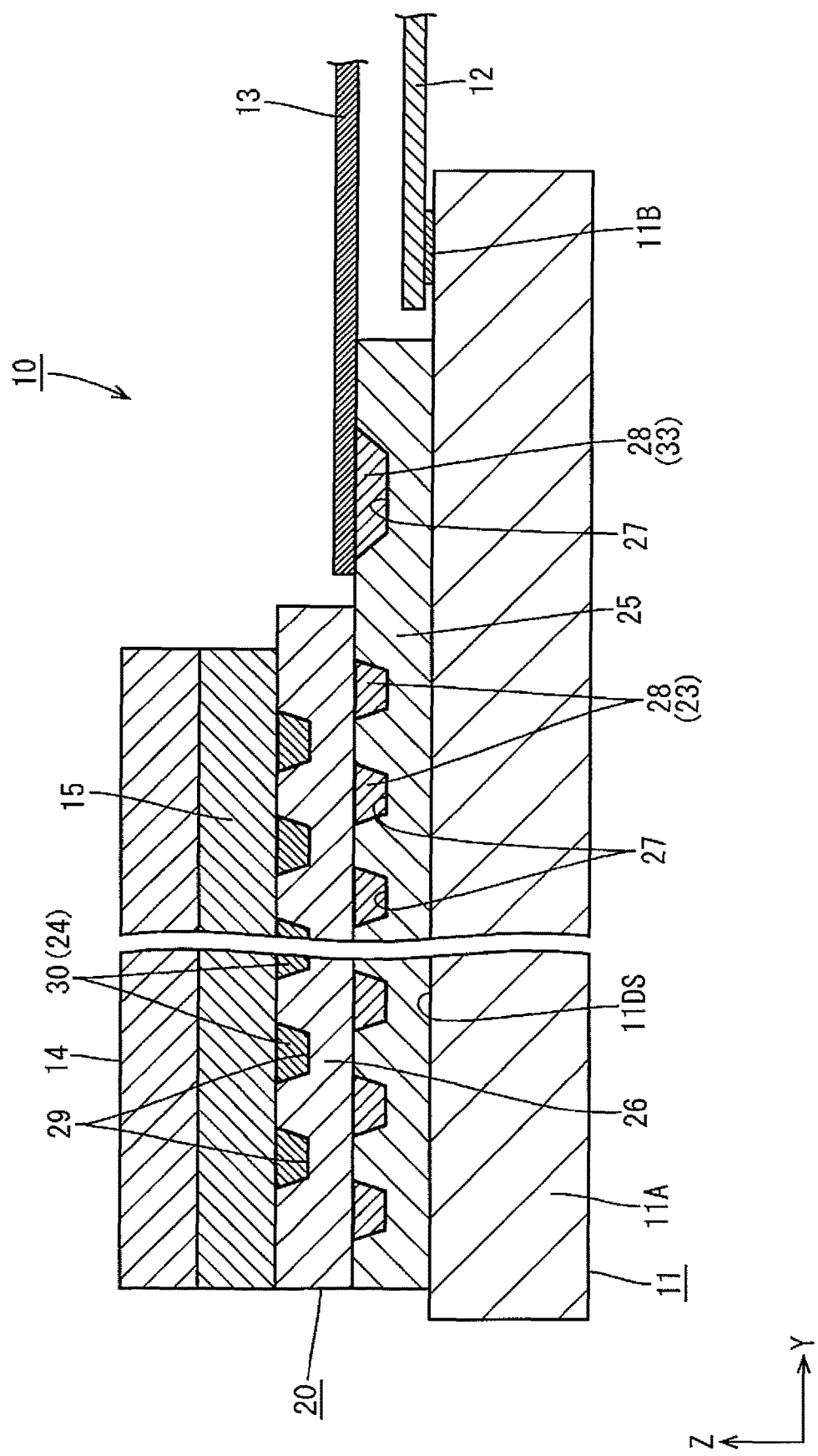
FIG. 2 is a schematic cross-sectional view of an end of an organic EL panel, and end of a touch panel, an end of a polarizing plate, and components around the ends.

First, a configuration of the organic EL display device 10 is described. As shown in FIGS. 1 and 2, the organic EL display device 10 has a horizontally long square shape as a whole, and has its long side direction corresponding to an X-axis direction, its short side direction corresponding to a Y-axis direction, and its plate thickness direction (direction normal to a plate surface) corresponding to a Z-axis direction. The organic EL display device 10 includes at least an organic EL panel (display panel, OLED display panel) 11 including, as a front side plate surface thereof, a display surface 11DS that is capable of displaying an image; a display flexible substrate (display panel connecting component) 12 that is connected to the organic EL panel 11; a touch panel 20, placed on the display surface 11DS of the organic EL panel 11, that detects a position (input position) that a user inputs; a touch panel flexible substrate (external component) 13 that is connected to the touch panel 20; and a polarizing plate 14 placed on a side of the touch panel 20 opposite to the organic EL panel 11. The organic EL panel 11, the polarizing plate 14, and the touch panel 20 each have a horizontally long square shape. Among these, the polarizing plate 14 includes a polarizing layer (polarizer) that selectively transmits linearly polarized light that oscillates in a particular direction, and is disposed so that the touch panel 20 is sandwiched between the polarizing plate 14 and the organic EL panel 11. Furthermore, the polarizing plate 14 includes a phase difference layer ($\lambda/4$ circularly polarizing plate) 15 on a plate surface thereof that faces the touch panel 20. The phase difference layer 15 is formed by applying a liquid crystal polymer material to the plate surface of the polarizing plate 14 that faces the touch panel 20, and imparts a phase difference of λ/4 to transmitted light. The phase difference layer 15 provides a reflected light suppressing function of selectively absorbing reflected light or other functions. Further, the polarizing plate 14 has a thickness of, for example, approximately 60 μm, including the phase difference layer 15.

As shown in FIG. 1, the display surface 11DS of the organic EL display panel 11 is divided into a display region (active area) AA where an image is displayed and a non-display region (non-active area) NAA, formed in the shape of a frame that surrounds the display region AA, where no image is displayed. It should be noted that FIG. 1 uses dot-and-dash lines to indicate the outer shape of the display region AA and the non-display region NAA is a region located on the outside of the dot-and-dash lines. As shown in FIG. 2, the organic EL panel 11 includes a base material 11A made of a flexible and substantially transparent synthetic resin (e.g. made of PET). The base material 11A has structures formed therein by using a known evaporation method or the like. Examples of the structures include an organic EL layer that emits light; a reflecting electrode that reflects light; a TFT (switching element), connected to the organic EL layer, that controls an electric current; a phosphor layer that forms the organic EL layer; a hygroscopic layer (moisture-proof layer) constituted by a multilayer film; and a sealant. The TFT includes a semiconductor film made of polycrystalline silicon or an oxide semiconductor. The base material 11A has a thickness of, for example, approximately 40 μm. Further, a dimension obtained by subtracting the thickness of the base material 11A from the thickness of the organic EL panel 11 is for example approximately 10 μm. Further, the front side surface of the organic EL panel 11 constitutes the display surface 11DS.

As shown in FIGS. 1 and 2, the display flexible substrate 12 and the touch panel flexible substrate 13 have flexibility by each including a film base material made of a synthetic resin material (such as polyimide resin), and each have a large number of wiring patterns on the base material. The display flexible substrate 12 has its first end connected to the base material 11A of the organic EL panel 11 and its second end connected to a control substrate serving as a signal supply source, so that signals responsible for image display or other signals that are supplied from the control substrate can be transmitted to the base material 11A. Meanwhile, the touch panel flexible substrate 13 has its first end connected to the touch panel 20 and its second end connected to the control substrate, so that signals responsible for position detection or other signals that are supplied from the control substrate can be transmitted to the touch panel 20. Provided at a first (lower side shown in FIG. 1) long-side end of the organic EL panel 11 is a panel terminal area 11B that is connected to an end of the display flexible substrate 12. Provided at a first long-side end of the touch panel 20 are terminals 33 and 34 that are connected to an end of the touch panel flexible substrate 13. The terminals 33 and 34 will be descried in detail later.

Figure 3:
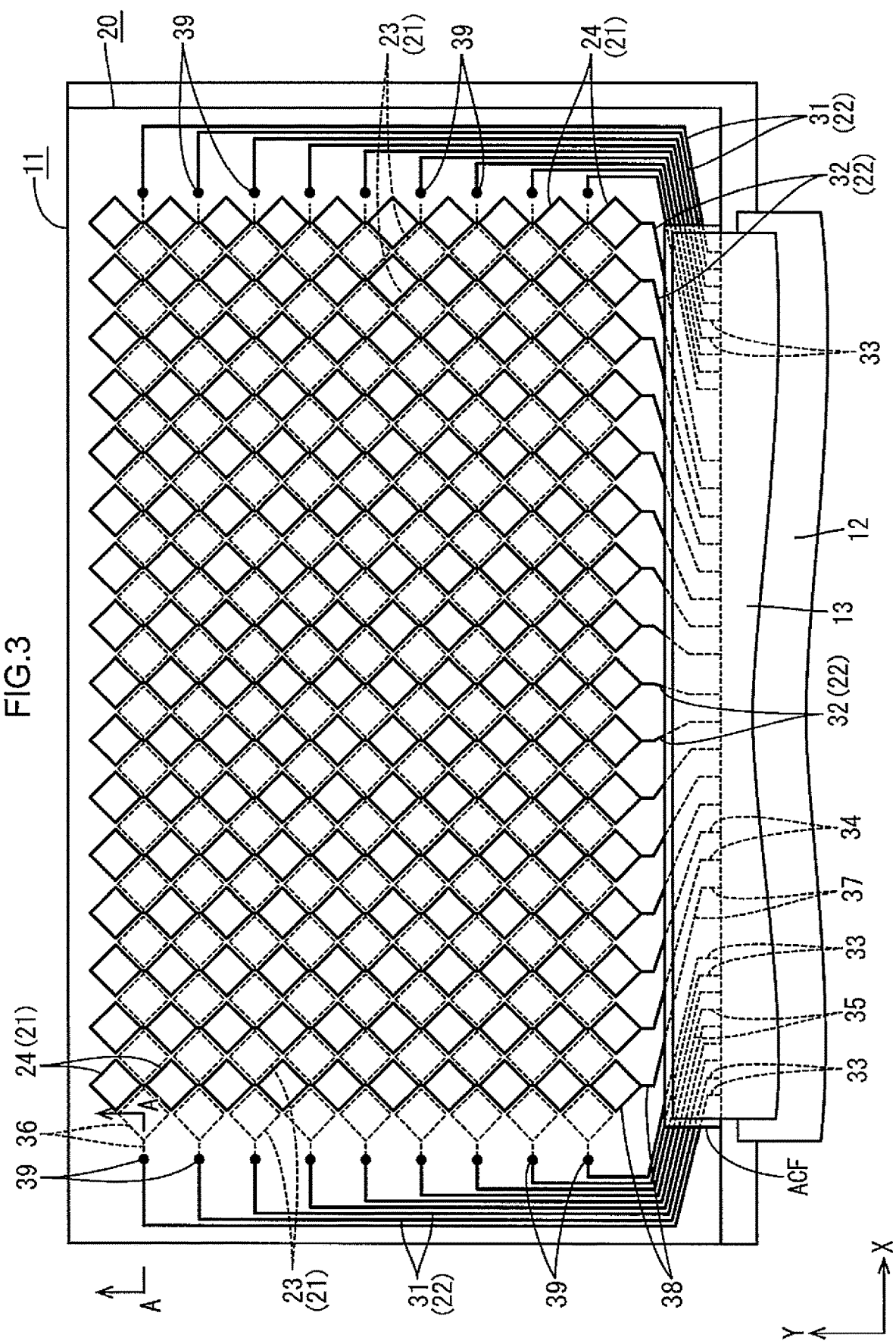
FIG. 3 is a plan view of the organic EL panel and the touch panel and a plan view schematically showing a touch panel pattern.

As already mentioned, the organic EL panel 11 according to the first embodiment have both a display function of displaying an image and a touch panel function (position input function) of detecting a position (input position) that the user inputs in accordance with an image displayed, and among these, the touch panel function is fulfilled by a touch panel pattern of the touch panel 20, which is integrated (in an on-cell form) with the organic EL panel 11. As shown in FIG. 2, the touch panel 20 is provided in such a manner as to overlap the front side of the organic EL panel 11. The touch panel 20 has a thickness of, for example, approximately 20 μm that is thinner than that of the base material 11A of the organic EL panel 11 and that of the polarizing plate 14. Further, a dimension obtained by adding together the dimension obtained by subtracting the thickness of the base material 11A from the thickness of the organic EL panel 11 and the thickness of the touch panel 20 is for example approximately 30 μm. Accordingly, the organic EL display device 10 has an extremely thin overall thickness of, for example, approximately 130 μm and is therefore superior in bendability and suitable for use especially in a foldable device. The touch panel pattern of the touch panel 20 is of a projected capacitance type, and adopts a detecting scheme of a mutual capacitance type. As shown in FIG. 3, the touch panel pattern includes at least multiple touch electrodes (position detecting electrodes) 21 arranged in a matrix in a plane of the touch panel 20. The touch electrodes 21 are placed in a region in the touch panel 20 that overlaps the display region AA of the organic EL panel 11. Accordingly, the display region AA in the organic EL panel 11 substantially corresponds to a touch region (position detecting region) TA that is capable of detecting an input position, and the non-display region NAA substantially corresponds to a non-touch region (non-position detecting region) NTA that is incapable of detecting an input position. Further, the non-touch region NTA in the touch panel 20 is provided with peripheral wires 22 each having its first end connected to a touch electrode 21 and its second end connected to a terminal 33 or 34 connected to the touch panel flexible substrate 13. Moreover, when the user moves a finger (position inputter, which is an electric conductor) closer to the touch panel 20 in an attempt to input a position in accordance with an image on the display region AA that the user views, capacitances are formed between the finger and touch electrodes 21. As a result, a capacitance that is detected by a touch electrode 21 located near the finger changes as the finger approaches, and is different from that which is detected by a touch electrode 21 situated away from the finger. This makes it possible to detect the input position in accordance with the difference.

In particular, the touch electrodes 21 include multiple first touch electrodes (first position detecting electrodes) 23 linearly arranged along an X-axis direction (first direction) and multiple second touch electrodes (second position detecting electrodes) 24 linearly arranged along a Y-axis direction (second direction) orthogonal to (intersecting) the X-axis direction. The first touch electrodes 23 and the second touch electrodes 24 each have a substantially rhombic planar shape, and are arranged in such a manner as to planarly fill the touch region TA in a plate surface of the touch panel 20, i.e. in such a manner so not to overlap each other. Further, the first touch electrodes 23 and the second touch electrodes 24 are each sized to have a diagonal dimension of, for example, approximately 5 mm. First touch electrodes 23 adjacent to one another in the X-axis direction have their mutually adjacent ends connected to one another, whereby multiple first touch electrodes 23 forming a line by being arranged along the X-axis direction are electrically connected to one another to constitute a group of first touch electrodes 23 arranged in a line along the X-axis direction, and this group of first touch electrodes 23 makes it possible to detect an input position in the X-axis direction. In the touch region TA of the touch panel 20, more than one of these groups of first touch electrodes 23 are placed at intervals in the Y-axis direction. Second touch electrodes 24 adjacent to one another in the Y-axis direction have their mutually adjacent ends connected to one another, whereby multiple second touch electrodes 24 forming a line by being arranged along the Y-axis direction are electrically connected to one another to constitute a group of second touch electrodes 24 arranged in a line along the Y-axis direction, and this group of second touch electrodes 24 makes it possible to detect an input position in the Y-axis direction. In the touch region TA in the touch panel 20, more than one of these groups of second touch electrodes 24 are placed at intervals in the X-axis direction. All this makes it possible to identify an input position in the X-axis direction and the Y-axis direction.

Places of connection between first touch electrodes 23 in the group of first touch electrodes 23 and places of connection between second touch electrodes 24 in the group of second touch electrodes 24 are disposed to overlap (intersect) each other, but are insulated from each other (prevented from becoming short-circuited with each other) by being placed in different layers from each other. In particular, as shown in FIG. 2, the touch panel 20 includes a stack of a first imprint layer 25, provided with the first touch electrodes 23, that has insulation properties and a second imprint layer 26, provided with the second touch electrodes 24, that has insulation properties, with the first imprint layer 25 placed relatively at the back, i.e. facing the organic EL panel 11, and the second imprint layer 26 placed relatively at the front, i.e. facing the polarizing plate 14. The first imprint layer 25 and the second imprint layer 26 are both made of an ultraviolet-curable resin material (curable material, photo-curable material) and each have a thickness of, for example, approximately 5 μm to 10 μm. The first imprint layer 25 and the second imprint layer 26 are stacked in a state of having been solidly spread over a large portion of the organic EL panel 11, on which the touch panel 20 is to be installed, excluding a part of the organic EL panel 11 (such as a place where the panel terminal area 11B is formed). That is, the first imprint layer 25 and the second imprint layer 26 are disposed not to overlap the panel terminal area 11B. The first imprint layer 25 is provided with a first groove (first conductive layer forming groove) 27 formed by partially depressing a front side surface of the first imprint layer 25 (opposite to the organic EL panel 11) and a first conductive layer 28, placed within the first groove 27, that constitutes a first touch electrode 23 or the like. Similarly, the second imprint layer 26 is provided with a second groove (second conductive layer forming groove) 29 formed by partially depressing a front side surface of the second imprint layer 26 (opposite to the first imprint layer 25) and a second conductive layer 30, placed within the second groove 29, that constitutes a second touch electrode 24 or the like. The first groove 27 and the second groove 29 are formed in the surfaces of the first imprint layer 25 and the second imprint layer 26, respectively, by a so-called imprint method. The first groove 27 and the second groove 29 have groove depths that are slightly smaller than half the thicknesses of the first imprint layer 25 and the second imprint layer 26, respectively. Specifically, the first groove 27 and the second groove 29 have groove depths of, for example, approximately less than 5 μm. The first conductive layer 28 and the second conductive layer 30 are formed by drying and curing, as a main material, metal ink (such as silver nanoink) containing a metal material (such as silver) having superior electrical conductivity. Although it is preferable, for the purpose of securing surface smoothness, that the first conductive layer 28 and the second conductive layer 30, formed in the first groove 27 and the second groove 29, have their outer surfaces flush with the outermost surfaces of the first imprint layer 25 and the second imprint layer 26, respectively, this is not necessarily intended to impose any limitation.

Figure 4:
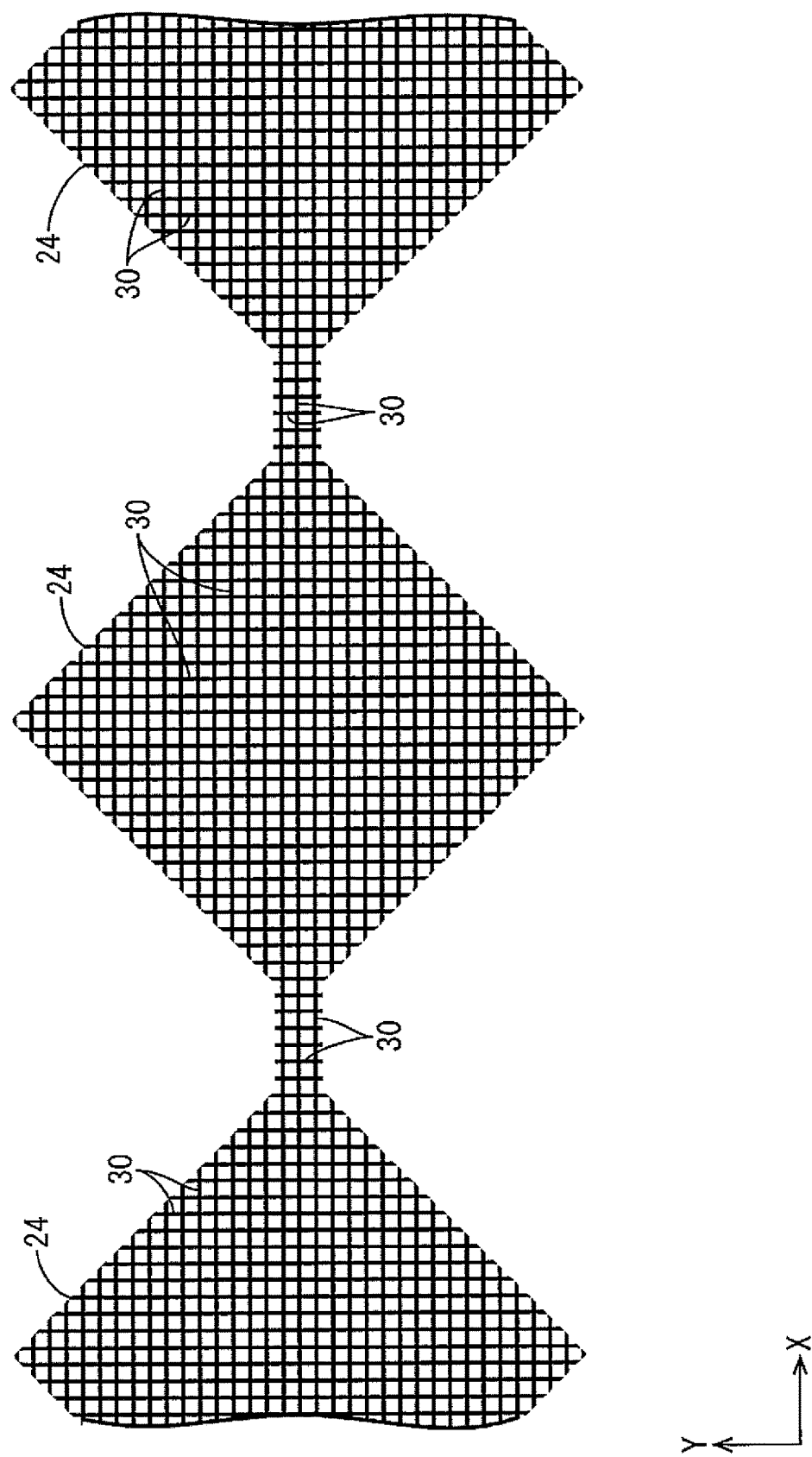
FIG. 4 is an enlarged plan view of second touch electrodes constituting the touch panel pattern.

As shown in FIG. 4, the first conductive layer 28 and the second conductive layer 30 have line widths of, for example, approximately 3 μm that are slightly smaller than the outer dimensions (approximately 5 mm) of the first touch electrodes 23 and the second touch electrodes 24, respectively, and include those which linearly extend along the X-axis direction and those which linearly extend along the Y-axis direction. It should be noted that although FIG. 4 representatively illustrates second touch electrodes 24 constituted by second conductive layers 30, first touch electrodes 23 constituted by first semiconductor layers 28 are identical in configuration. A large number of those first and second conductive layers 28 and 30 which linearly extend along the X-axis direction are arranged in parallel at intervals in the Y-axis direction, and a large number of those first and second conductive layers 28 and 30 which linearly extend along the Y-axis direction are arranged in parallel at intervals in the X-axis direction, whereby groups of first conductive layers 28 and groups of second conductive layers 30 are routed in a netlike pattern (mesh pattern) in the ranges of formation of the first touch electrodes 23 and the second touch electrodes 24, respectively. Further, first conductive layers 28 intersecting each other are electrically short-circuited with each other, and second conductive layers 30 intersecting each other are electrically short-circuited with each other. This makes it easy for light to pass through the first touch electrodes 23 and the second touch electrodes 24 in the touch region TA of the touch panel 20, thereby making it possible to attain a sufficient display luminance of an image in the display region AA of the organic EL panel 11. Thus, although the first conductive layers 28 and the second conductive layers 30 are minute, these minute first and second conductive layers 28 and 30 can be placed in appropriate locations in the plane of the touch panel 20, as the ranges of formation of the first conductive layers 28 and the second conductive layers 30 are defined in advance by the first groove 27 and the second groove 29, respectively. As is the case with the first conductive layers 28 and the second conductive layers 30, the first groove 27 and the second groove 29, within which a first conductive layer 28 and a second conductive layer 30 are placed, respectively, include a large number of those which extend linearly along the X-axis direction and a large number of those which extend linearly along the Y-axis direction, whereby groups of first grooves 27 and groups of second grooves 29 form a grid-like pattern. Further, first grooves 27 intersecting each other communicate with each other, and second grooves 29 intersecting each other communicate with each other.

As shown in FIG. 3, the peripheral wires 22 include first peripheral wires 31 connected to the first touch electrodes 23 and second peripheral wires 32 connected to the second touch electrodes 24. The first peripheral wires 31 are arranged in pairs so that the groups of first touch electrodes 23 that extend along the X-axis direction are put between the pairs of first peripheral wires 31 on both sides in a direction of extension (X-axis direction) of the groups of first touch electrodes 23, and each of the pairs of first peripheral wires 31 are connected to both ends, respectively, of a corresponding one of the groups of first touch electrodes 23. Each first peripheral wire 31 is routed toward a region of mounting of the touch panel flexible substrate 13 from an end of a corresponding one of the groups of first touch electrodes 23 in the direction of extension. The second peripheral wires 32 are routed fanwise toward the region of mounting of the touch panel flexible substrate 13 from ends, located on a lower side shown in FIG. 3 (facing the touch panel flexible substrate 13), of the groups of second touch electrodes 24 that extend along the Y-axis direction. The region of mounting of the touch panel flexible substrate 13 is provided with a first terminal 33 and a second terminal 34 that are electrically connected via an anisotropic conductive film ACF to terminals on the side of the touch panel flexible substrate 13. Moreover, ends of first and second peripheral wires 31 and 32 opposite to ends of the first and second peripheral wires 31 and 32 that are connected to a group of first touch electrodes 23 and a group of second touch electrodes 24 are connected to a first terminal 33 and a second terminal 34, respectively. More than one of these first and second terminals 33 and 34 are placed at intervals along the X-axis direction in the region of mounting of the touch panel flexible substrate 13. Whereas the multiple second terminals 34 constitute one terminal group by being placed on a center side in the X-axis direction in the region of mounting of the touch panel flexible substrate 13, the multiple first terminals 33 constitute two terminal groups by being placed in groups at both ends between which the group of second terminals 34 is put in the X-axis direction in the region of mounting of the touch panel flexible substrate 13. The first peripheral wires 31, the second peripheral wires 32, the first terminals 33, and the second terminals 34 are all placed in the non-touch region NTA of the touch panel 20, i.e. the non-display region NAA of the organic EL panel 11. Accordingly, portions of the first and second conductive layers 28 and 30 (first and second grooves 27 and 29) that constitute the first peripheral wires 31, the second peripheral wires 32, the first terminals 33, and the second terminals 34 do not necessarily need to be formed in a netlike pattern unlike portions of them that constitute the first touch electrodes 23 and the second touch electrodes 24 and, for example, may be formed to be identical in width to the first peripheral wires 31, the second peripheral wires 32, the first terminals 33, and the second terminals 34.

As shown in FIG. 2, the second touch electrodes 24 and the second peripheral wires 32, which are placed in the foremost surface of the touch panel 20, are mostly (excluding the second terminals 34) covered by the polarizing plate 14 attached to the front side of the touch panel 20. Since the polarizing plate 14 prevents the second touch electrodes 24 and the second peripheral wires 32 from exposed outward, the second touch electrodes 24 and the second peripheral wires 32 are protected.

Figure 5:
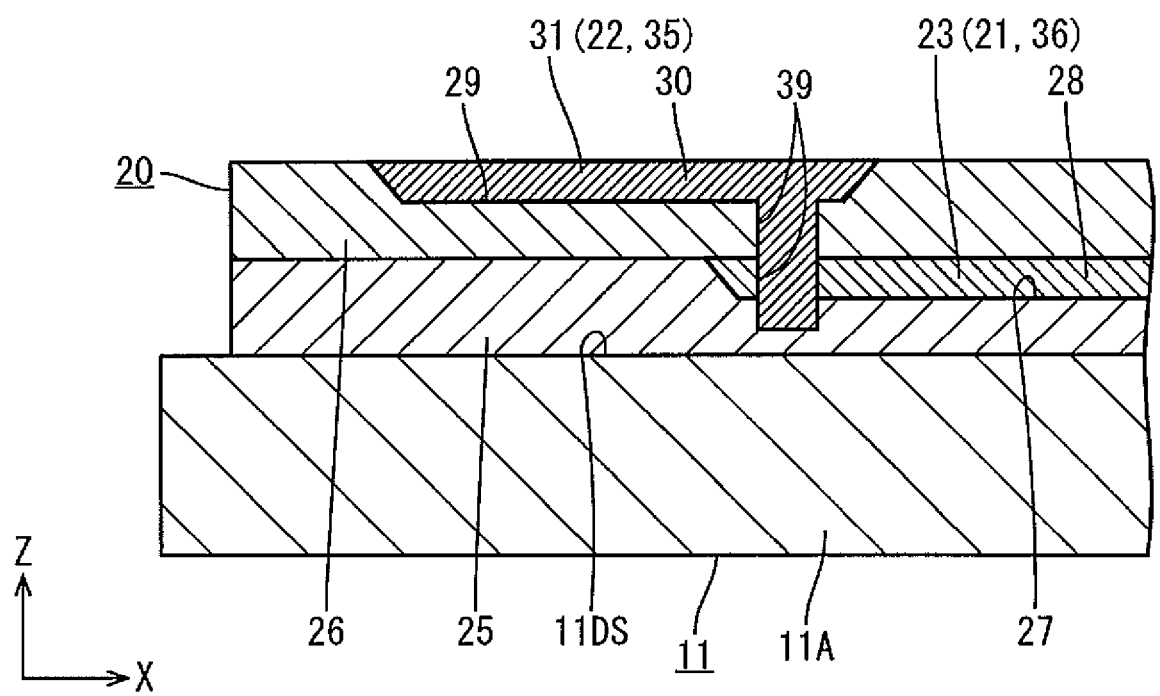
FIG. 5 is a cross-sectional view of the organic EL panel and the touch panel as taken along line A-A in FIG. 3.

In the first embodiment, as shown in FIG. 3, the first peripheral wires 31 and the first terminals 33 constitute first terminal side conductive parts 35 that include the first terminals 33, and the first touch electrodes 23 constitute first non-terminal side conductive parts 36 that do not include the first terminals 33. Similarly, the second peripheral wires 32 and the second terminals 34 constitute second terminal side conductive parts 37 that include the second terminals 34, and the second touch electrodes 24 constitute second non-terminal side conductive parts 38 that do not include the second terminals 34. Among these, the first non-terminal side conductive parts 36 are constituted by the first conductive layers 28, whereas the first terminal side conductive parts 35, the second terminal side conductive parts 37, and the second non-terminal side conductive parts 38 are all constituted by the second conductive layers 30. That is, it is only the first touch electrodes 23 that are constituted by the first conductive layers 28, and the second touch electrodes 24, the first peripheral wires 31, the second peripheral wires 32, the first terminals 33, and the second terminals 34 are all constituted by the second conductive layers 30. Moreover, as shown in FIGS. 3 and 5, the first touch electrodes 23, which are the first non-terminal side conductive parts 36 constituted by the first conductive layers 28, and the first peripheral wires 31, which are the first terminal side conductive parts 35 constituted by the second conductive layers 30, have portions overlapping each other and are electrically continuously connected directly to each other through contact holes 39 bored through the second imprint layer 26 interposed between the overlapping portions. This achieves an electrically continuous connection between the first terminal side conductive parts 35 and the first non-terminal side conductive parts 36, which are constituted by different conductive layers 28 and 30 from each other. It should be noted that FIG. 3 illustrates the contact holes 39 with filled circles. The contact holes 39 are disposed to communicate with parts of the second grooves 29 in the second imprint layer 26. Accordingly, the contact holes 39 as well as the second grooves 29 are filled with the second conductive layers 30. On the other hand, the second peripheral wires 32, which are the second terminal side conductive parts 37 constituted by the second conductive layer 30, and the second touch electrodes 24, which are the second non-terminal side conductive parts 38 constituted by the second conductive layer 30, are joined directly to each other.

As noted above, the first peripheral wires 31 and the first terminals 33, which constitute the first terminal side conductive parts 35, and the second peripheral wires 32 and the second terminals 34, which constitute the second terminal side conductive parts 37, are both constituted by the second conductive layers 30. Note here that if a configuration in which first terminal side conductive parts are constituted by the first conductive layers 28 and second terminal side conductive parts are constituted by the second conductive layers 30 is adopted, a design needs to be made with such consideration that first terminals placed on a lower level are not covered by the second imprint layer 26 placed on an upper level. Specifically, there arises the need for selectively notching portions of the second imprint layer 26 that overlap the first terminals constituted by the first conductive layers 28. In comparison, the first embodiment eliminates the need for such consideration and therefore makes it possible to adopt a design of a highly-dense arrangement of the first terminal side conductive parts 35 and the second terminal side conductive parts 37. This makes it possible to narrow the ranges of placement of the first terminal side conductive parts 35 and the second terminal side conductive parts 37, so that a narrower frame can be suitably achieved. In addition, the formation of a difference in level between the first terminals 33 and the second terminals 34, which are both constituted by the second conductive layers 30, is avoided, so that it becomes easy to mount the touch panel flexible substrate 13, which is connected to the first terminals 33 and the second terminals 34.

Moreover, the second imprint layer 26 is disposed to overlap a surface of the first imprint layer 25 in which the first grooves 27 are formed, and the first terminals 33 and the second terminals 34, which are constituted by the second conductive layers 30, are formed in the second grooves 29 formed in a surface of the second imprint layer 26 opposite to the first imprint layer 25. Note here that if first terminals and second terminals are both constituted by the first conductive layers 28, it is necessary to give such consideration, for example, that portions of the second imprint layer 26 that overlap the first terminals and the second terminals are selectively notched so that the first terminals and the second terminals are not covered by the second imprint layer 26. In this regard, since the first terminals 33 and the second terminals 34 are both constituted by the second conductive layers 30, it is no longer necessary to give particular consideration in forming the second imprint layer 26. That is, it is no longer necessary to partially notch the second imprint layer 26. This makes it easy to manufacture the touch panel 20.

Furthermore, the first peripheral wires 31 included in the first terminal side conductive parts 35 constituted by the second conductive layers 30 and the first touch electrodes 23 included in the first non-terminal side conductive parts 36 constituted by the first conductive layers 28 are connected to each other through the contact holes 39. If first peripheral wires are included in first non-terminal side conductive parts constituted by the first conductive layers 28, the first peripheral wires and the first terminals 33 are connected to each other through the contact holes 39, so that the contact holes 39 are placed near the first terminals 33, which are high in wiring density, and the frame width tends to be great. In comparison, with a configuration in which the first peripheral wires 31 and the first touch electrodes 23 are connected to each other through the contact holes 39, the contact holes 39 are placed near the first touch electrodes 23, which are low in wiring density, so that a narrower frame can be more suitably achieved.

The organic EL display device 10 according to the first embodiment is structured as noted above, and the following describes methods for manufacturing an organic EL display device 10 and a touch panel 20. The method for manufacturing a touch panel 20 includes a first imprint layer forming step of forming a first imprint layer 25 on a display surface 11DS (surface) of an organic EL panel 11, a first groove forming step (first imprint step) of forming a first groove 27 by partially depressing a surface of the first imprint layer 25, a first conductive layer forming step of forming a first conductive layer 28 in the first groove 27, a second imprint layer forming step of forming a second imprint layer 26 on the front side surface of the first imprint layer 25 in which the first groove 27 has been formed, a second groove forming step (second imprint step) of forming a second groove 29 by partially depressing a surface of the second imprint layer 26, a contact hole forming step of boring a contact hole 39 through the second imprint layer 26, and a second conductive layer forming step of forming a second conductive layer 30 in the second groove 29 and the contact hole 39.

Figure 6:
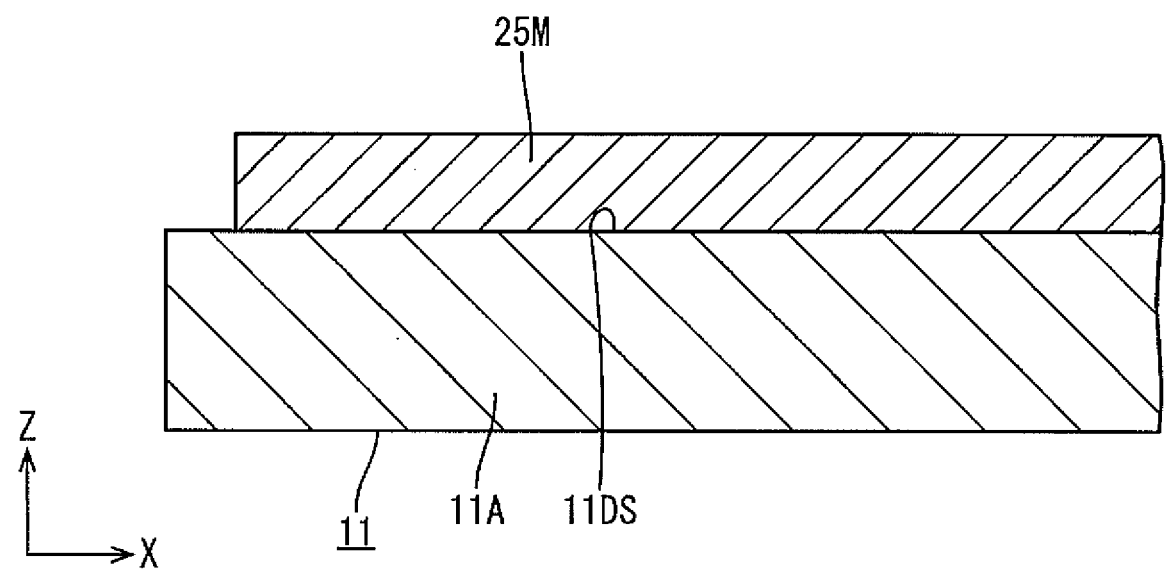
FIG. 6 is a cross-sectional view, taken along line A-A in FIG. 3, that shows a state where a first imprint layer has been formed on an organic EL panel in a first imprint layer forming step of a method for manufacturing a touch panel.
Figure 7A:
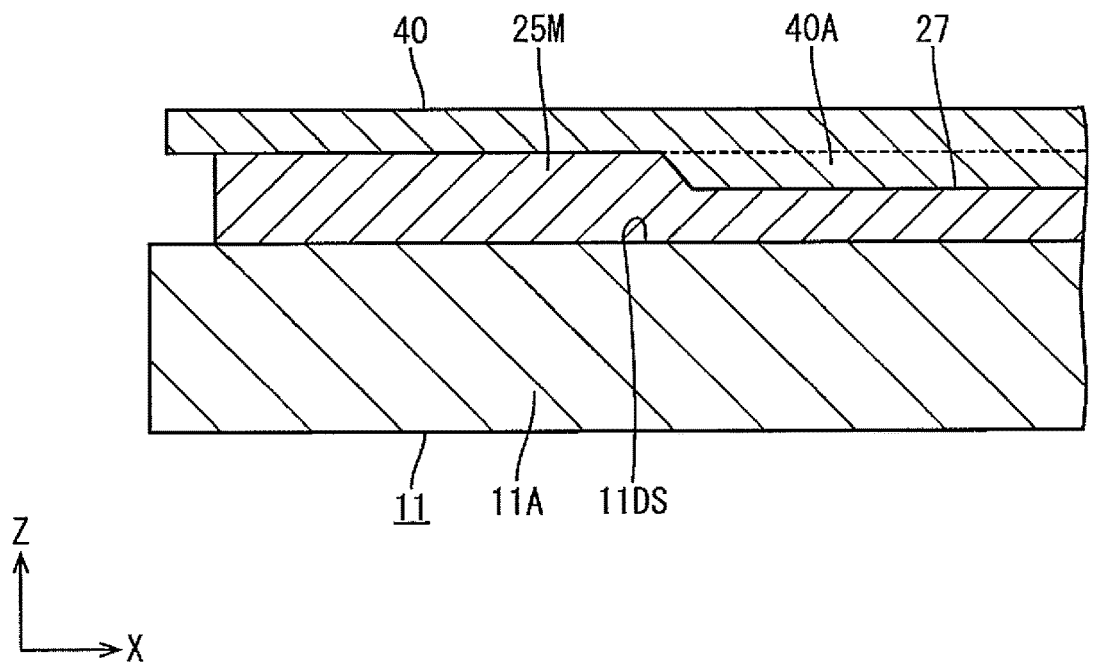
FIG. 7A is a cross-sectional view, taken along line A-A in FIG. 3, that shows a state where a first imprint block has been pressed onto an uncured first imprint layer in a first groove forming step of the method for manufacturing a touch panel.
Figure 7B:
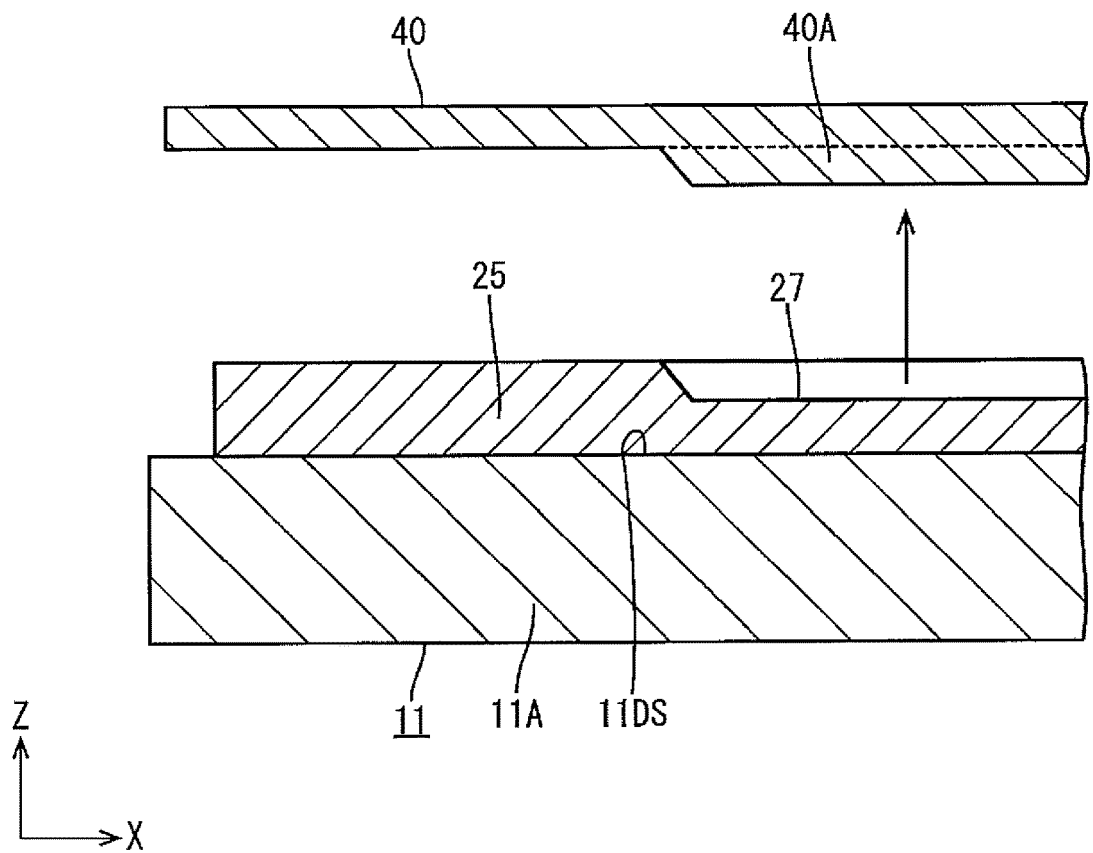
FIG. 7B is a cross-sectional view, taken along line A-A in FIG. 3, that shows a state where a first groove has been formed with the first imprint layer cured in the first groove forming step of the method for manufacturing a touch panel.

In the first imprint layer forming step, as shown in FIG. 6, a first imprint layer 25 made of an ultraviolet-curable resin material 25M is formed on the display surface 11DS of the organic EL panel 11. In this first imprint layer forming step, the ultraviolet-curable resin material (material of the first imprint layer 25) 25M is applied in an uncured state to the surface of the organic EL panel 11 by using a coating applicator such as a dispenser. Next, in the first groove forming step, as shown in FIG. 7A, a first imprint block (first pattern mask, first transfer block) 40 is pressed onto a surface of the ultraviolet-curable resin material 25M in an uncured state. The first imprint layer 25 is compressed and deformed into a thickness of approximately 5 µm to 10 µm by a force exerted by the first imprint block 40. Note here that the first imprint block 40 has a fine first protrusion (protruding portion) 40A formed by transferring the shape of a first groove 27 to a contact surface (molding surface) of the first imprint block 40 that comes into contact with the first imprint layer 25. Accordingly, the first imprint layer 25, onto which the first imprint block 40 has been pressed, comes to have a portion depressed by the first protrusion 40A being pressed into the portion. Irradiating the first imprint layer 25 with ultraviolet rays in this state causes the ultraviolet-curable resin material 25M, which has been in an uncured state, of the first imprint layer 25 to be completely cured. After that, as shown in FIG. 7B, removing the first imprint block 40 from the first imprint layer 25 causes the first groove 27 to be formed by the portion of the first imprint layer 25 into which the first protrusion 40A of the first imprint block 40 was pressed. That is, the first groove 27 is formed by the first imprint block 40 being transferred to the first imprint layer 25.

Figure 8A:
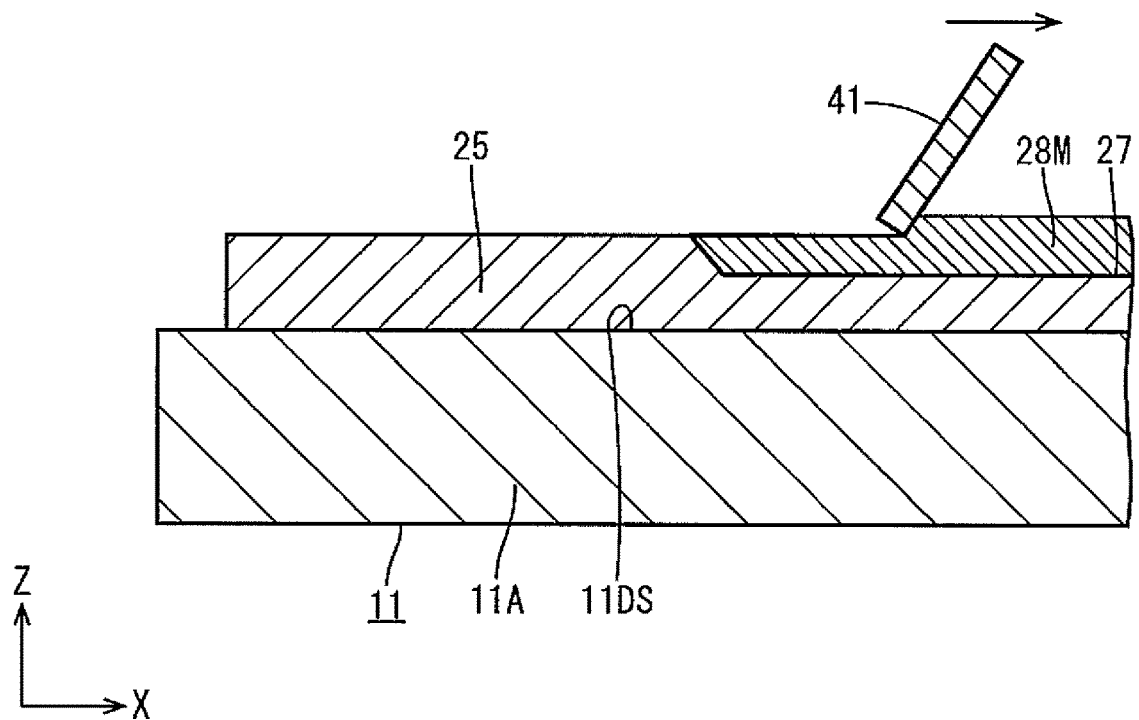
FIG. 8A is a cross-sectional view, taken along line A-A in FIG. 3, that shows a task of filling the first groove with a material of a first conductive layer with a squeegee in a first conductive layer forming step of the method for manufacturing a touch panel.
Figure 8B:
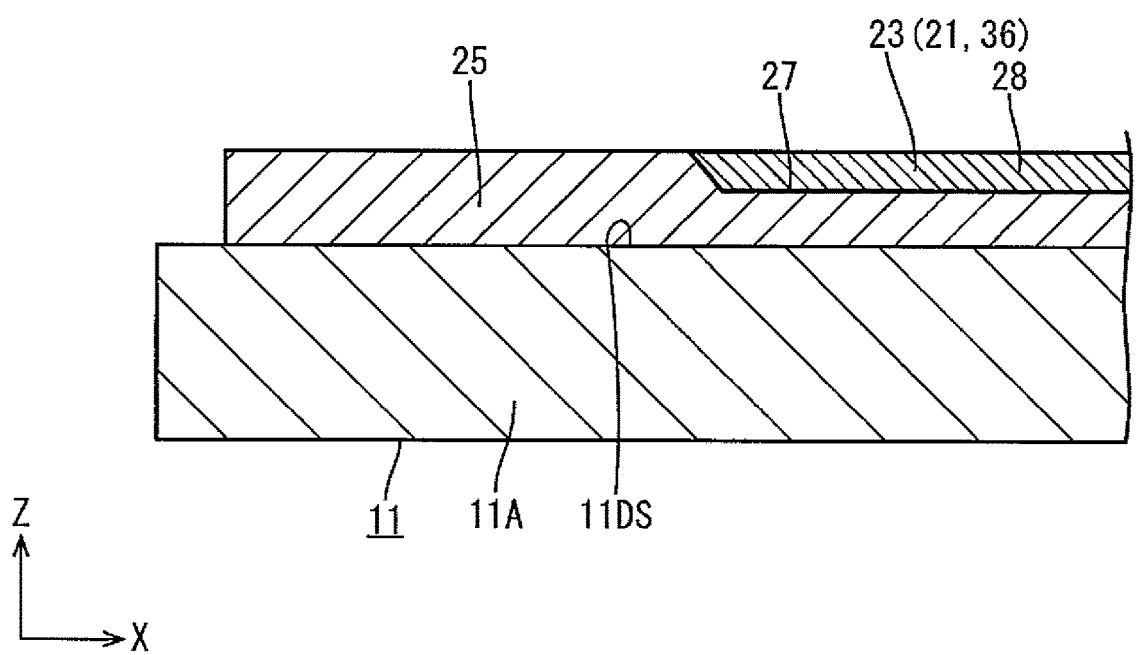
FIG. 8B is a cross-sectional view, taken along line A-A in FIG. 3, that shows a state where the first conductive layer has been formed in the first conductive layer forming step of the method for manufacturing a touch panel.

In the first conductive layer forming step, as shown in FIG. 8A, a material 28M of a first conductive layer 28 is applied to the surface of the first imprint layer 25 in which the first groove 27 has been formed. The material 28M of the first conductive layer 28 has good fluidity and the like by being metal nanoink prepared by dispersedly solving nanoparticles of a metal material such as silver in a solvent composed of water, alcohol, and the like. The material 28M, which has been applied to the surface of the first imprint layer 25, of the first conductive layer 28 fills the first groove 27 and is placed outside the first groove 27. After that, as shown in FIG. 8B, when a squeegee 41 is slid along the surface of the first imprint layer 25, the material 28M of the first conductive layer 28 that is present on the surface of the first imprint layer 25 outside the first groove 27 is removed by the squeegee 41, but the material 28M of the first conductive layer 28 that is present in the first groove 27 remains without being removed by the squeegee 41. Further, even if some of a large number of these first grooves 27 do not have their internal spaces filled with the material 28M of the first conductive layer 28, the internal spaces are filled with the material 28M of the first conductive layer 28 collected by the squeegee 41 from outside the first grooves 27. As a result, all of the first grooves 27 are filled with the material 28M of the first conductive layer 28. After that, the solvent contained in the material 28M of the first conductive layer 28 is evaporated by using a dryer, whereby the first conductive layer 28 is formed in the first groove 27. In this way, as shown in FIG. 9, first touch electrodes 23 (first non-terminal side conductive parts 36 that do not include the first terminals 33) constituted by first conductive layers 28 are patterned in the surface of the first imprint layer 25. It should be noted that a drying temperature in the dryer is for example approximately 80° C. and, in comparison with a photolithography step and a deposition step that are executed in the process of manufacturing the organic EL panel 11, a processing temperature is so low that harmful effects on structures (such as a phosphor layer, TFTs, pixel electrodes) provided inside the organic EL panel 11 are avoided.

Figure 10:
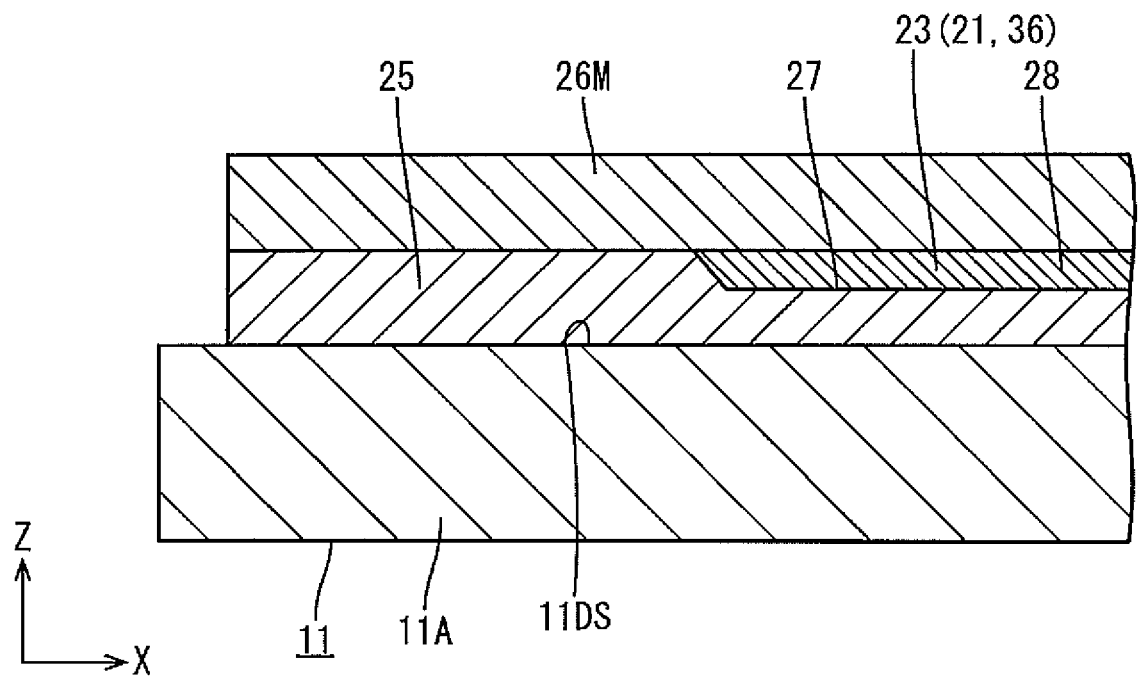
FIG. 10 is a cross-sectional view, taken along line A-A in FIG. 3, that shows a state where a second imprint layer has been formed over the organic EL panel in a second imprint layer forming step of the method for manufacturing a touch panel.
Figure 11A:
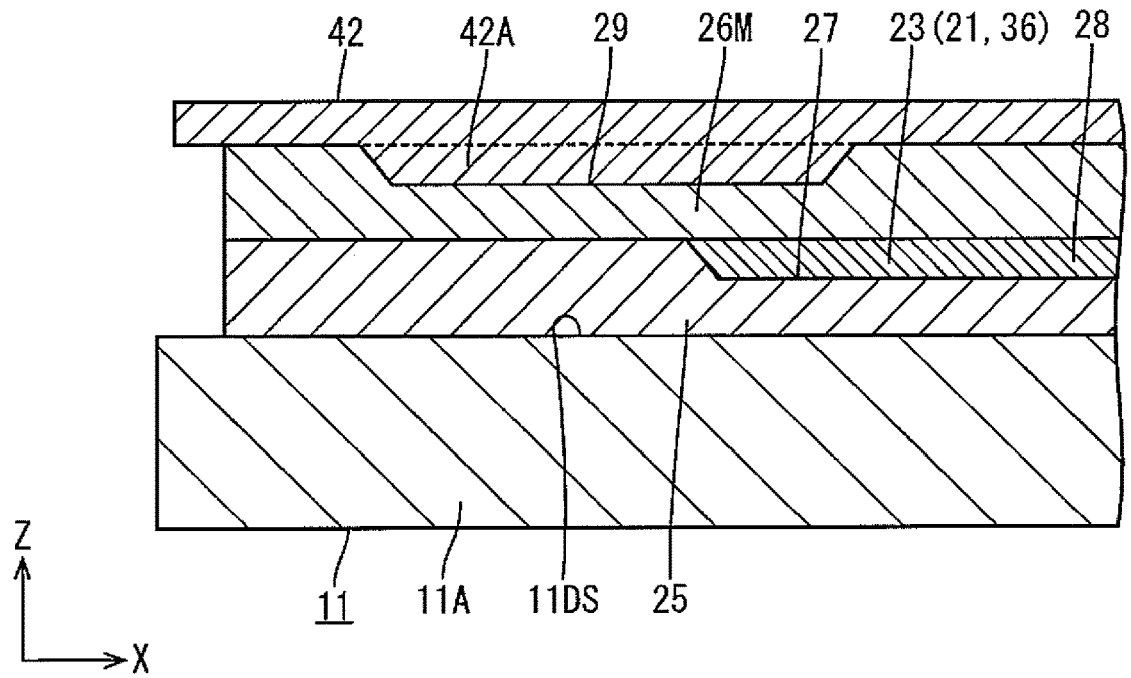
FIG. 11A is a cross-sectional view, taken along line A-A in FIG. 3, that shows a state where a second imprint block has been pressed onto an uncured second imprint layer in a second groove forming step of the method for manufacturing a touch panel.
Figure 11B:
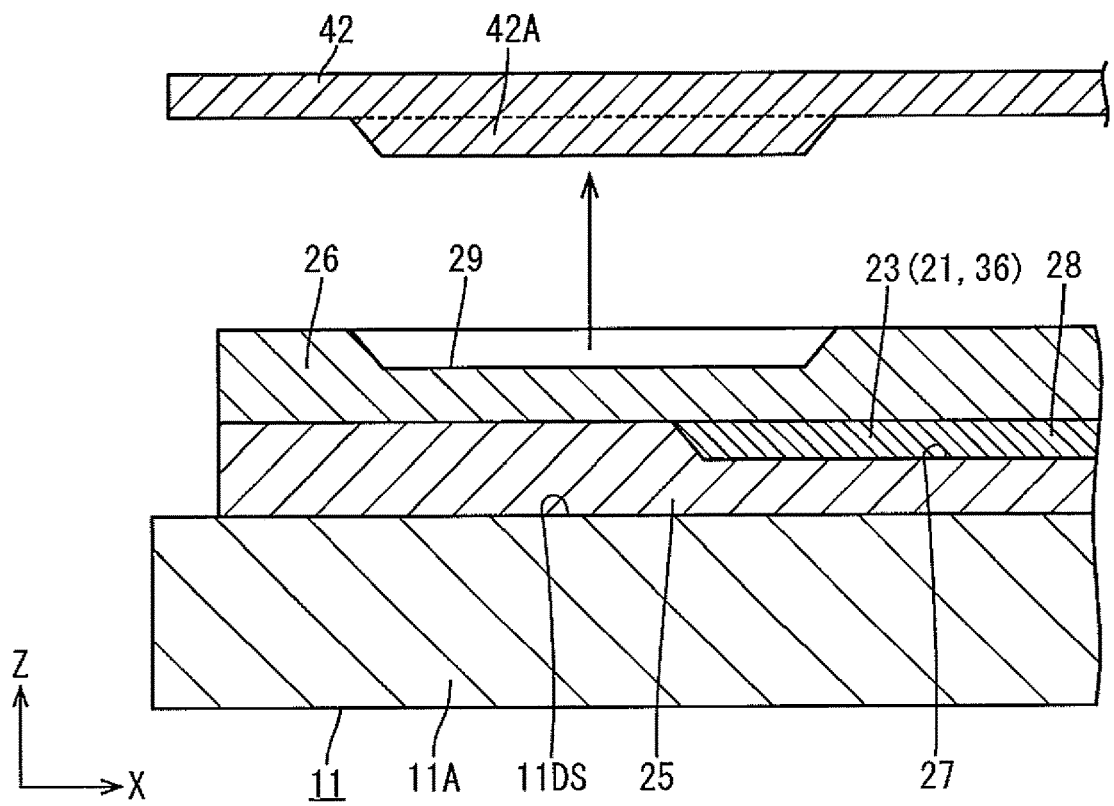
FIG. 11B is a cross-sectional view, taken along line A-A in FIG. 3, that shows a state where a second groove has been formed with the second imprint layer cured in the second groove forming step of the method for manufacturing a touch panel.

In the second imprint layer forming step, as shown in FIG. 10, a second imprint layer 26 made of an ultraviolet-curable resin material 26M is formed on the surface of the first imprint layer 25 (surface in which the first groove 27 has been formed). In this second imprint layer forming step, the ultraviolet-curable resin material (material of the second imprint layer 26) 26M is applied in an uncured state to the surface of the first imprint layer 25 by using a coating applicator such as a dispenser. That is, the second imprint layer forming step involves the use of the same printing method as the first imprint layer forming step. Next, in the second groove forming step, as shown in FIG. 11A, a second imprint block (second pattern mask, second transfer block) 42 is pressed onto a surface of the ultraviolet-curable resin material 26M in an uncured state. The second imprint layer 26 is compressed and deformed into a thickness of approximately 5 µm to 10 µm by a force exerted by the second imprint block 42. Note here that the second imprint block 42 has a fine second protrusion (protruding portion) 42A formed by transferring the shape of a second groove 29 to a contact surface (molding surface) of the second imprint block 42 that comes into contact with the second imprint layer 26. Accordingly, the second imprint layer 26, onto which the second imprint block 42 has been pressed, comes to have a portion depressed by the second protrusion 42A being pressed into the portion. Irradiating the second imprint layer 26 with ultraviolet rays in this state causes the ultraviolet-curable resin material 26M, which has been in an uncured state, of the second imprint layer 26 to be completely cured. After that, as shown in FIG. 11B, removing the second imprint block 42 from the second imprint layer 26 causes the second groove 29 to be formed by the portion of the second imprint layer 26 into which the second protrusion 42A of the second imprint block 42 was pressed. That is, the second groove 29 is formed by the second imprint block 42 being transferred to the second imprint layer 26.

Figure 12:
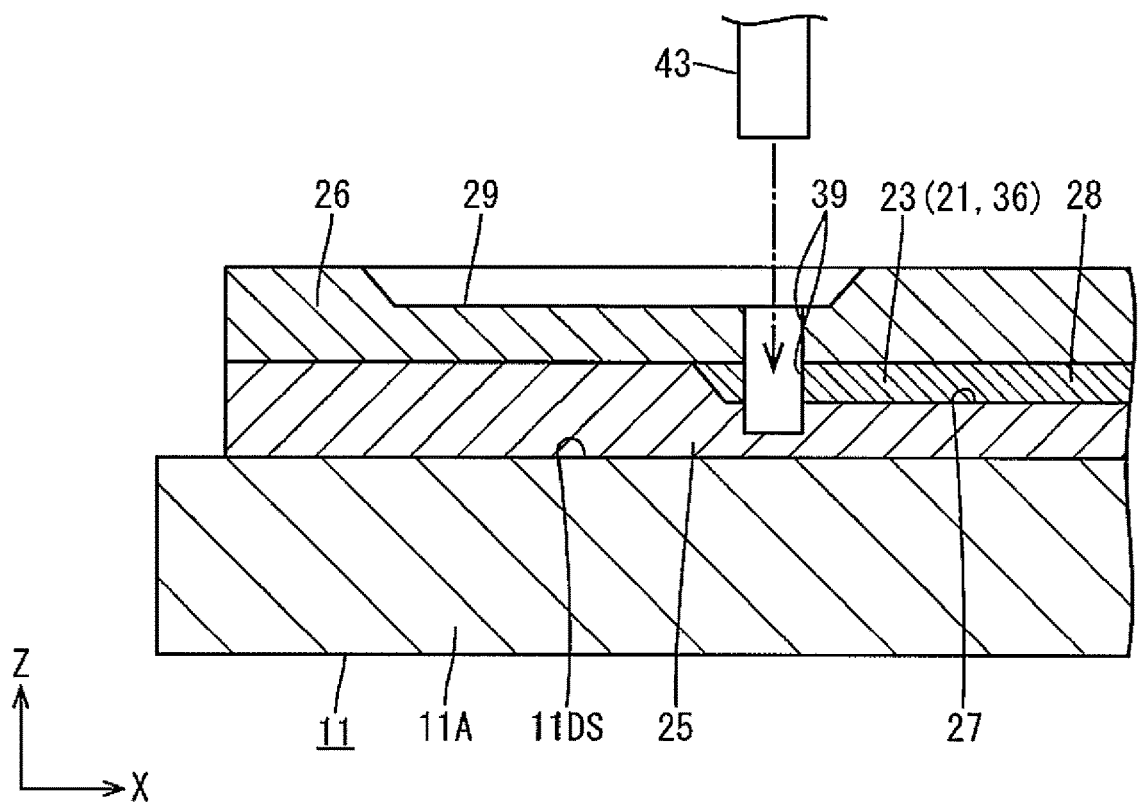
FIG. 12 is a cross-sectional view, taken along line A-A in FIG. 3, that shows a state where a contact hole has been formed in the second imprint layer in a contact hole forming step of the method for manufacturing a touch panel.

In the contact hole forming step, as shown in FIG. 12, a predetermined place in the second imprint layer 26 is irradiated with laser light by using a laser irradiator 43 such as a picosecond pulse laser irradiator or a femtosecond laser irradiator. This effects so-called laser ablation in the place in the second imprint layer 26 that has been irradiated with laser light, whereby a contact hole 39 is bored. This allows the contact hole 39 to be formed with high accuracy of position and with high certainty. At this point in time, the irradiation with laser light is performed until the control hole 39 at least comes to have such a depth as to penetrate through the second imprint layer 26. It should be noted that the irradiation with laser light may be performed until the contact hole 39 comes to have such a depth as to penetrate through the first conductive layer 28 and, furthermore, comes to have such a depth as to reach the first imprint layer 25. The place in the second imprint layer 26 that is irradiated with laser light is a location where apart of the second groove 29 and each end of a group of first touch electrodes 23 (first non-terminal side conductive parts 36) that extends along the X-axis direction overlap each other. Accordingly, the contact hole 39 that is bored through the place in the second imprint layer 26 that is irradiated with laser light is disposed to communicate with the second groove 29 and face each end of the group of first touch electrodes 23 that extends along the X-axis direction.

Figure 13:
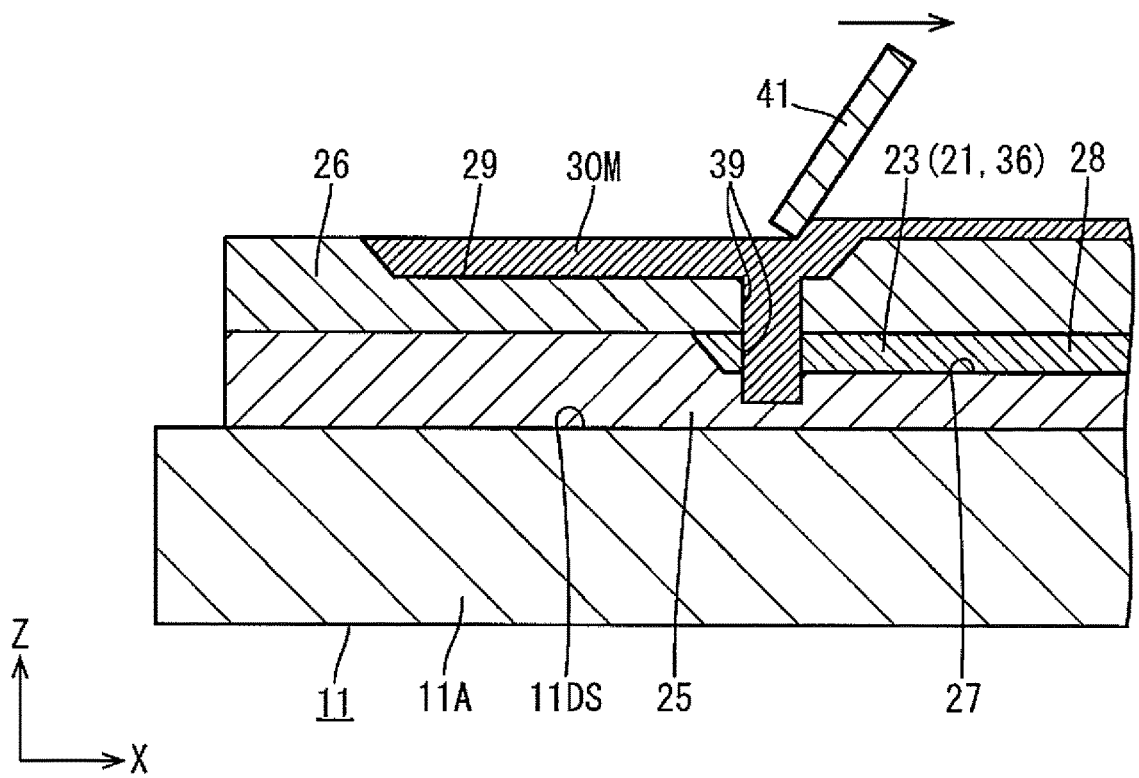
FIG. 13 is a cross-sectional view, taken along line A-A in FIG. 3, that shows a task of filling the second groove with a material of a second conductive layer with the squeegee in a second conductive layer forming step of the method for manufacturing a touch panel.

In the second conductive layer forming step, as shown in FIG. 13, a material 30M of a second conductive layer 30 is applied to the surface of the second imprint layer 26 in which the second groove 29 and the contact hole 39 have been formed. The material 30M of the second conductive layer 30 has good fluidity and the like by being metal nanoink prepared by dispersedly solving nanoparticles of a metal material such as silver in a solvent composed of water, alcohol, and the like. The material 30M, which has been applied to the surface of the second imprint layer 26, of the second conductive layer 30 fills the second groove 29 and the contact hole 39 and is placed outside the second groove 29. After that, when the squeegee 41 is slid along the surface of the second imprint layer 26, the material 30M of the second conductive layer 30 that is present on the surface of the second imprint layer 26 outside the second groove 29 is removed by the squeegee 41, but the material 30M of the second conductive layer 30 that is present in the second groove 29 and the contact hole 39 remains without being removed by the squeegee 41. Further, even if some of a large number of these second grooves 29 do not have their internal spaces filled with the material 30M of the second conductive layer 30, the internal spaces are filled with the material 30M of the second conductive layer 30 collected by the squeegee 41 from outside the second grooves 29. As a result, all of the second grooves 29 and the contact hole 39 are filled with the material 30M of the second conductive layer 30. After that, the solvent contained in the material 30M of the second conductive layer 30 is evaporated by using a dryer, whereby as shown in FIG. 5, the second conductive layer 30 is formed in the second groove 29 and the contact hole 39.

Figure 14:
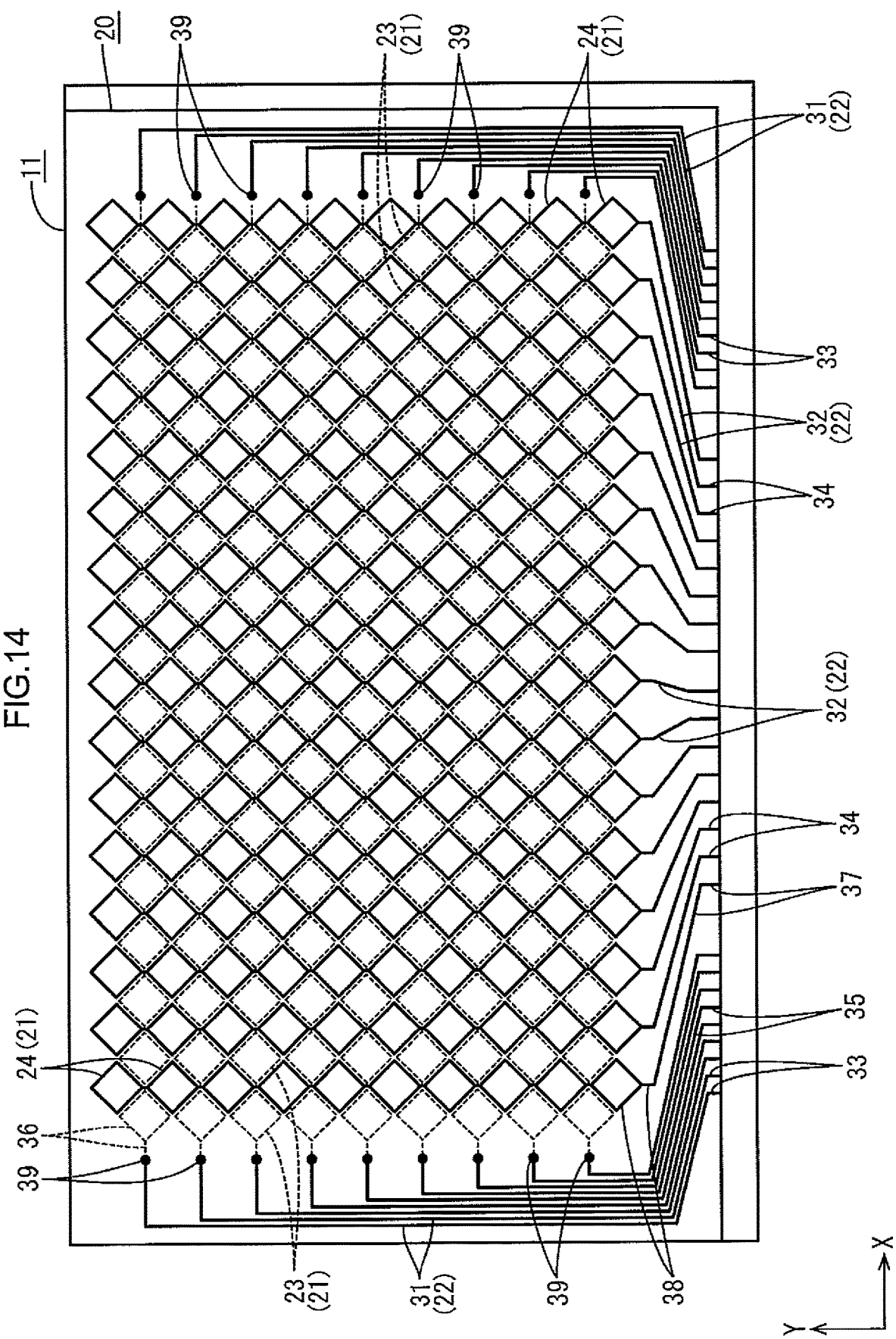
FIG. 14 is a plan view showing a state where the second conductive layer has been formed through the second conductive layer forming step of the method for manufacturing a touch panel.

In this way, as shown in FIG. 14, second touch electrodes 24 (second non-terminal side conductive parts 38) constituted by second conductive layers 30, first peripheral wires 31 (first terminal side conductive parts 35), second peripheral wires 32 (second terminal side conductive parts 37), first terminals 33 (first terminal side conductive parts 35), and second terminals 34 (second terminal side conductive parts 37) are patterned in the surface of the second imprint layer 26. Ends of the first peripheral wires 31 (first terminal side conductive parts 35), which are portions of the second conductive layers 30 that are placed within the contact holes 39, opposite to the first terminals 33 are electrically continuously connected to ends of the groups of first touch electrodes 23 (first non-terminal side conductive parts 36), constituted by the first conductive layers 28, that extend along the X-axis direction. Note here that the second conductive layers 30 constitute, in addition to the second terminal side conductive parts 37 constituted by the second peripheral wires 32 and the second terminals 34 and the second non-terminal side conductive parts 38, constituted by the second touch electrodes 24, that does not include the second terminals 34, the first terminal side conductive parts 35, constituted by the first peripheral wires 31 and the first terminals 33, that partially overlap the contact holes 39. That is, the first terminal side conductive parts 35 and the second terminal side conductive parts 37 respectively including the first terminals 33 and the second terminals 34 that are each connected to the touch panel flexible substrate 13 are both constituted by the second conductive layers 30; therefore, if a configuration in which first terminal side conductive parts are constituted by the first conductive layers 28 and second terminal side conductive parts are constituted by the second conductive layers 30 is adopted, a design needs to be made with such consideration that the first terminals 33 placed on a lower level are not covered by the second imprint layer 26 placed on an upper level, and in comparison, such configuration is no longer needed, so that the ranges of placement of the first terminal side conductive parts 35 and the second terminal side conductive parts 37 can be narrowed. As a result, a narrower frame can be suitably achieved. In addition, the formation of a difference in level between the first terminals 33 and the second terminals 34, which are both constituted by the second conductive layers 30, is avoided, so that it becomes easy to mount the touch panel flexible substrate 13, which is connected to the first terminals 33 and the second terminals 34. It should be noted that a drying temperature in the dryer is for example approximately 80° C. and, in comparison with a photolithography step and a deposition step that are executed in the process of manufacturing the organic EL panel 11, a processing temperature is so low that harmful effects on structures (such as a phosphor layer, TFTs, pixel electrodes) provided inside the organic EL panel 11 are avoided.

As described above, a touch panel (wiring board) 20 according to the first embodiment includes: a first imprint layer 25 having a first groove 27 formed by partially depressing a surface of the first imprint layer 25; a first conductive layer 28 formed in the first groove 27; a second imprint layer 26 stacked on the first imprint layer 25, the second imprint layer 26 having a second groove 29 formed by partially depressing a surface of the second imprint layer 26 and a contact hole 39 that communicates with at least a part of the second groove 29; a second conductive layer 30 formed in the second groove 29 and the contact hole 39; a first terminal side conductive part 35, constituted by the second conductive layer 30, that includes a first terminal 33 to which a touch panel flexible substrate (external component) 13 is connected, the first terminal side conductive part 35 being disposed to at least partially overlap the contact hole 39; a first non-terminal side conductive part 36, constituted by the first conductive layer 28, that does not include the first terminal 33, the first non-terminal side conductive part 36 being disposed to at least partially overlap the contact hole 39; a second terminal side conductive part 37, constituted by the second conductive layer 30, that includes a second terminal 34 to which the touch panel flexible substrate 13 is connected; and a second non-terminal side conductive part 38, constituted by the second conductive layer 30, that does not include the second terminal 34, the second non-terminal side conductive part 38 being joined to the second terminal side conductive part 37.

In this way, the partially depressed first groove 27 is formed in the surface of the first imprint layer 25, and the first conductive layer 28 is formed in the first groove 27. The partially depressed second groove 29 is formed in the surface of the second imprint layer 26, which is stacked on the first imprint layer 25, and the second conductive layer 30 is formed in the second groove 29. The second imprint layer 26 has the contact hole 39, bored therethrough, which communicates with at least a part of the second groove 29, and the second conductive layer 30 is also formed in the contact hole 39. The touch panel 20 has the first terminal 33 and the second terminal 34, to each of which the touch panel flexible substrate 13 is connected, and among these, the first terminal 33 is included in the first terminal side conductive part 35, whereas the second terminal 34 is included in the second terminal side conductive part 37. Moreover, the first terminal side conductive parts 35 and the second terminal side conductive parts 37 are both constituted by the second conductive layer 30; therefore, if a configuration in which a first terminal side conductive part and a second terminal side conductive part are constituted by different conductive layers is adopted, a design needs to be made with such consideration that the first terminal 33 or second terminal 34 placed on a lower level is not covered by the first imprint layer 25 or second imprint layer 26 placed on an upper level, and in comparison, such configuration is no longer needed, so that the ranges of placement of the first terminal side conductive part 35 and the second terminal side conductive part 37 can be narrowed. As a result, a narrower frame can be suitably achieved. In addition, the formation of a difference in level between the first terminal 33 and the second terminal 34, which are both constituted by the second conductive layer 30, is avoided, so that it becomes easy to mount the touch panel flexible substrate 13, which is connected to the first terminal 33 and the second terminal 34. Whereas the second terminal side conductive part 37 constituted by the second conductive layer 30 is joined to the second non-terminal side conductive part 38, constituted by the second conductive layer 30, that does not include the second terminal 34, the first terminal side conductive part 35 constituted by the second conductive layer 30 is connected through the contact hole 39 to the first non-terminal side conductive part 36, constituted by the first conductive layer 28, that does not include the first terminal 33. This achieves an electrically continuous connection between the first terminal side conductive part 35 and the first non-terminal side conductive part 36, which are constituted by different conductive layers 28 and 30 from each other.

Further, the second imprint layer 26 is disposed to overlap a surface of the first imprint layer 25 in which the first groove 27 is formed. In this way, the first terminal 33 and the second terminal 34, which are constituted by the second conductive layer 30, are formed in the second groove 29 formed in a surface of the second imprint layer 26 opposite to the first imprint layer 25. Note here that if a first terminal and a second terminal are both constituted by the first conductive layer 28, it is necessary to give such consideration that the first terminal and the second terminal are not covered by the second imprint layer 26. In this regard, since the first terminal 33 and the second terminal 34 are both constituted by the second conductive layer 30, it is no longer necessary to give particular consideration in forming the second imprint layer 26. This makes it easy to manufacture the touch panel 20.

Further, at least parts of the first non-terminal side conductive part 36 and the second non-terminal side conductive part 38 include a first touch electrode (first position detecting electrode) 23 and a second touch electrode (second position detecting electrode) 24, respectively, that form capacitances with a position inputter that inputs a position, that are capable of detecting a position inputted by the position inputter, and that do not overlap each other. In this way, the position inputted by the position inputted can be detected by the first touch electrode 23 and the second touch electrode 24, respectively included in the first non-terminal side conductive part 36 and the second non-terminal side conductive part 38, that do not overlap each other.

Further, the touch panel 20 further includes a touch region (position detecting region) TA where the first touch electrode 23 and the second touch electrode 24 are placed; and a non-touch region (non-position detecting region) NTA where at least the first terminal 33 and the second terminal 34 are placed and the first touch electrode 23 and the second touch electrode 24 are not placed. In the touch panel 20, the first terminal side conductive part 35 and the second terminal side conductive part 37 are placed in the non-touch region NTA and include a first peripheral wire 31 and a second peripheral wire 32 that connect the first touch electrode 23 and the second touch electrode 24 to the first terminal 33 and the second terminal 34, respectively. In this way, the first touch electrode 23 and the second touch electrode 24, that are respectively included in the first non-terminal side conductive part 36 and the second non-terminal side conductive part 38, are supplied with signals from the first terminal 33 and the second terminal 34, respectively, via the first peripheral wire 31 and the second peripheral wire 32, which are respectively included in the first terminal side conductive part 35 and the second terminal side conductive part 37. The first peripheral wire 31 included in the first terminal side conductive part 35 constituted by the second conductive layer 30 and the first touch electrode 23 included in the first non-terminal side conductive part 36 constituted by the first conductive layer 28 are connected to each other through the contact hole 39. If the first peripheral wire is included in a first non-terminal side conductive part constituted by the first conductive layer 28, the first peripheral wire and the first terminal 33 are connected to each other through the contact hole 39, so that the contact hole 39 is placed near the first terminal 33, which is high in wiring density, and the frame width tends to be great. In comparison, with a configuration in which the first peripheral wire 31 and the first touch electrode 23 are connected to each other through the contact hole 39, the contact hole 39 is placed near the first touch electrode 23, which is low in wiring density, so that a narrower frame can be more suitably achieved.

Further, an organic EL display device (display device) 10 according to the first embodiment includes: the touch panel 20 described above; and an organic EL panel (display panel) 11 on a surface of which the touch panel 20 is placed. According to the organic EL display device 10 thus configured, the touch panel 20 placed on the surface of the organic EL panel 11 has a narrow frame, so that a narrower frame of the organic EL display device 10 can be suitably achieved. This provides superior appearance.

Further, the first imprint layer 25 is made of an ultraviolet-curable resin material. This makes manufacturing possible even if the organic EL panel 11 does not have high heat resistance, as compared with the case of a first imprint layer made of a thermosetting resin material.

Further, the organic EL display panel 11 is made of synthetic resin and has flexibility. This makes manufacturing possible with an imprint technique, as the first imprint layer 25 is made of an ultraviolet-curable resin material, although the organic EL panel 11 is lower in heat resistance than an inflexible organic EL panel made of glass. The organic EL panel 11 on a surface of which the touch panel 20 has been placed has sufficient flexibility to be suitable for foldable use.

Further, a method for manufacturing a touch panel 20 according to the second embodiment includes: a first imprint layer forming step of forming a first imprint layer 25; a first groove forming step of forming a first groove 27 by partially depressing a surface of the first imprint layer 25; a first conductive layer forming step of forming, in the first groove 27, a first conductive layer 28 that constitutes a first non-terminal side conductive part 36 that does not include a first terminal 33 that is connected to a touch panel flexible substrate 13; a second imprint layer forming step of forming a second imprint layer 26 in such a manner that the second imprint layer 26 overlaps the first imprint layer 25; a second groove forming step of forming a second groove 29 by partially depressing a surface of the second imprint layer 26; a contact hole forming step of boring a contact hole 39 through a location in the second imprint layer 26 that overlaps a part of the second groove 29 and at least a part of the first non-terminal side conductive part 36; and a second conductive layer forming step of forming, in the second groove 29 and the contact hole 39, a first terminal side conductive part 35 that includes the first terminal 33 and is disposed to at least partially overlap the contact hole 39, a second terminal side conductive part 37 including a second terminal 34 that is connected to the touch panel flexible substrate 13, and a second non-terminal side conductive part 38 that does not include the second terminal 34.

In the first imprint layer forming step, a first imprint layer 25 is formed. In the first groove forming step, a first groove 27 is formed by partially depressing a surface of the first imprint layer 25. In the first conductive layer forming step, a first conductive layer 28 that constitutes a first non-terminal side conductive part 36 that does not include a first terminal 33 is formed in the first groove 27 in the first imprint layer 25. In the second imprint layer forming step, a second imprint layer 26 is formed in such a manner as to overlap the first imprint layer 25. In the second groove forming step, a second groove 29 is formed by partially depressing a surface of the second imprint layer 26. In the contact hole forming step, a contact hole 39 is bored through a location that overlaps a part of the second groove 29 and at least a part of the first non-terminal side conductive part 36. The contact hole 39 that is formed in this step is disposed to communicate with the second groove 29 and face the first non-terminal side conductive part 36. In the second conductive layer forming step, a second conductive layer 30 is formed in the second groove 29 and the contact hole 39. Accordingly, a portion (first terminal side conductive part 35) of the second conductive layer 30 that is placed within the contact hole 39 is electrically continuously connected to the first non-terminal side conductive part 36 constituted by the first conductive layer 28. Note here that the second conductive layer 30 constitutes, in addition to the second terminal side conductive part 37, which includes the second terminal 34, and the second non-terminal side conductive part 38, which does not include the second terminal 34, the first terminal side conductive part 35, which includes the first terminal 33 and is disposed to at least partially overlap the contact hole 39. That is, the first terminal side conductive part 35 and the second terminal side conductive part 37 respectively including the first terminal 33 and the second terminal 34 that are each connected to the touch panel flexible substrate 13 are both constituted by the second conductive layer 30; therefore, if a configuration in which a first terminal side conductive part and a second terminal side conductive part are constituted by different conductive layers is adopted, a design needs to be made with such consideration that the first terminal 33 or second terminal 34 placed on a lower level is not covered by the first imprint layer 25 or second imprint layer 26 placed on an upper level, and in comparison, such configuration is no longer needed, so that the ranges of placement of the first terminal side conductive part 35 and the second terminal side conductive part 37 can be narrowed. As a result, a narrower frame can be suitably achieved. In addition, the formation of a difference in level between the first terminal 33 and the second terminal 34, which are both constituted by the second conductive layer 30, is avoided, so that it becomes easy to mount the touch panel flexible substrate 13, which is connected to the first terminal 33 and the second terminal 34.

Further, in the contact hole forming step, the contact hole 39 is bored through the second imprint layer 26 by laser ablation. This allows the contact hole 39 to be formed in the second imprint layer 26 with high accuracy of position and with high certainty.

Second Embodiment

Figure 15A:
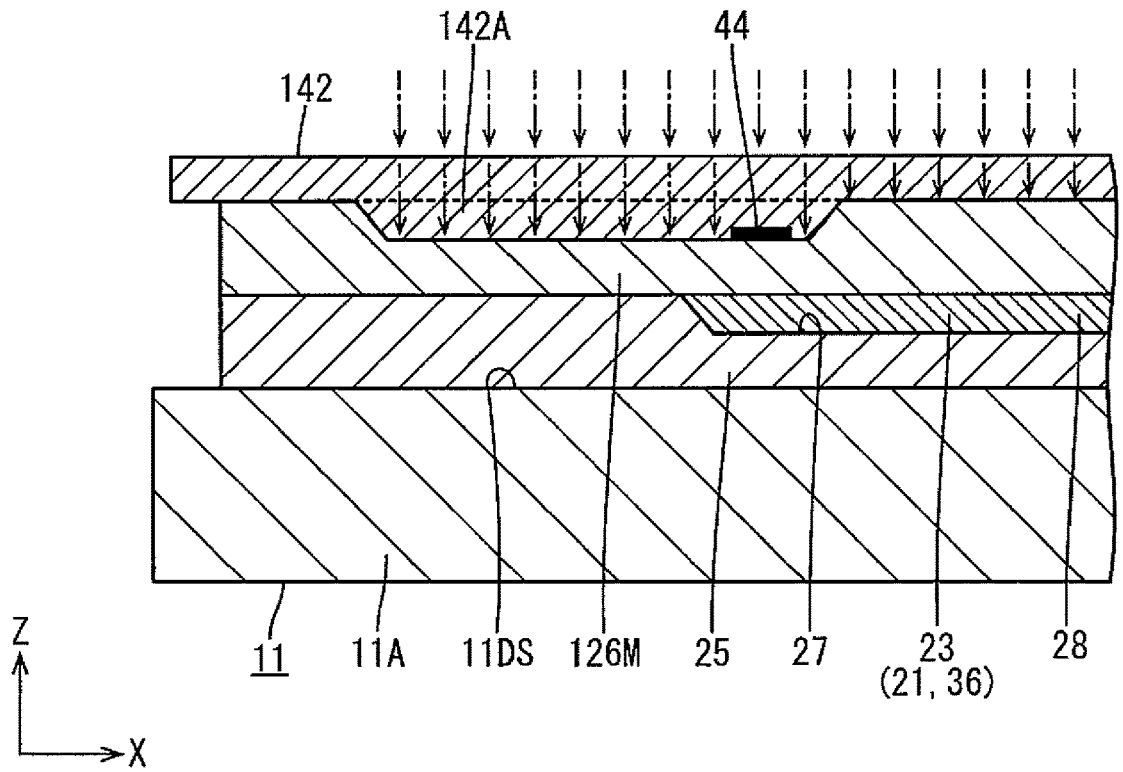
FIG. 15A is a cross-sectional view showing a state where a second imprint block has been pressed onto an uncured second imprint layer in a second groove forming step of a method for manufacturing a touch panel according to a second embodiment.
Figure 15B:
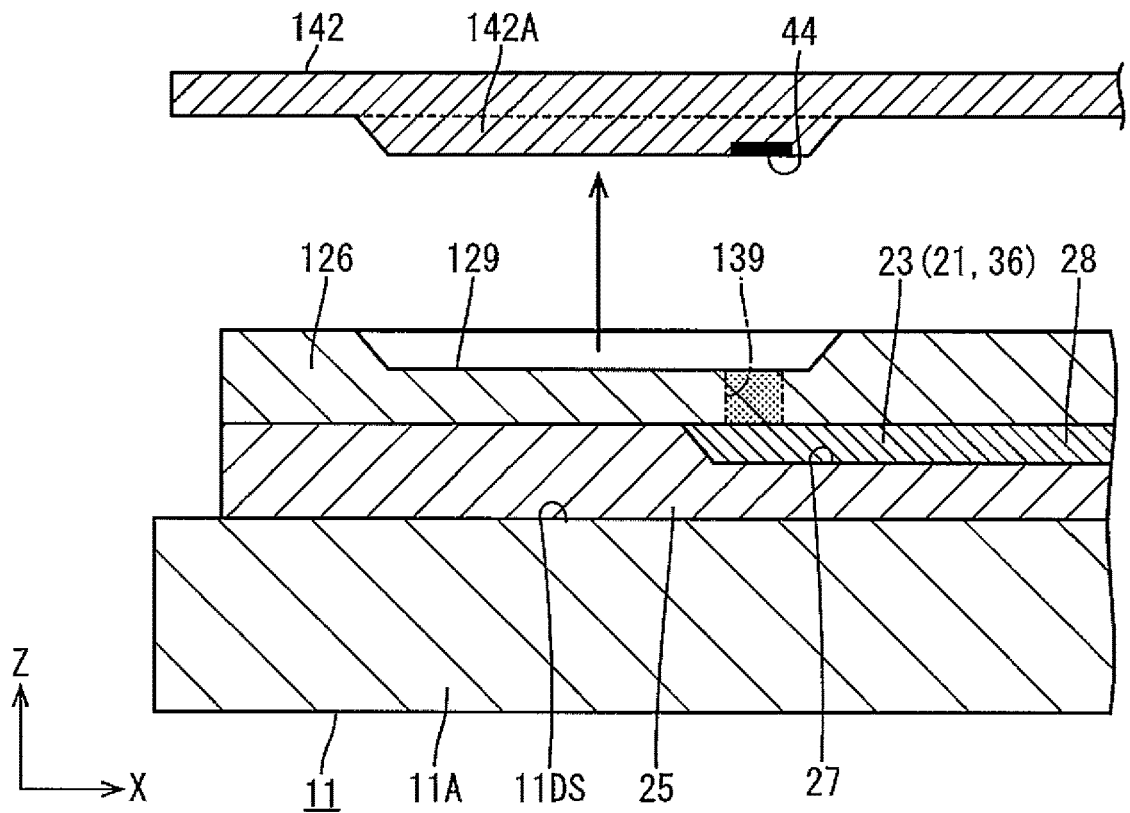
FIG. 15B is a cross-sectional view showing a state where a second groove has been formed with the second imprint layer cured in the second groove forming step of the method for manufacturing a touch panel.
Figure 16:
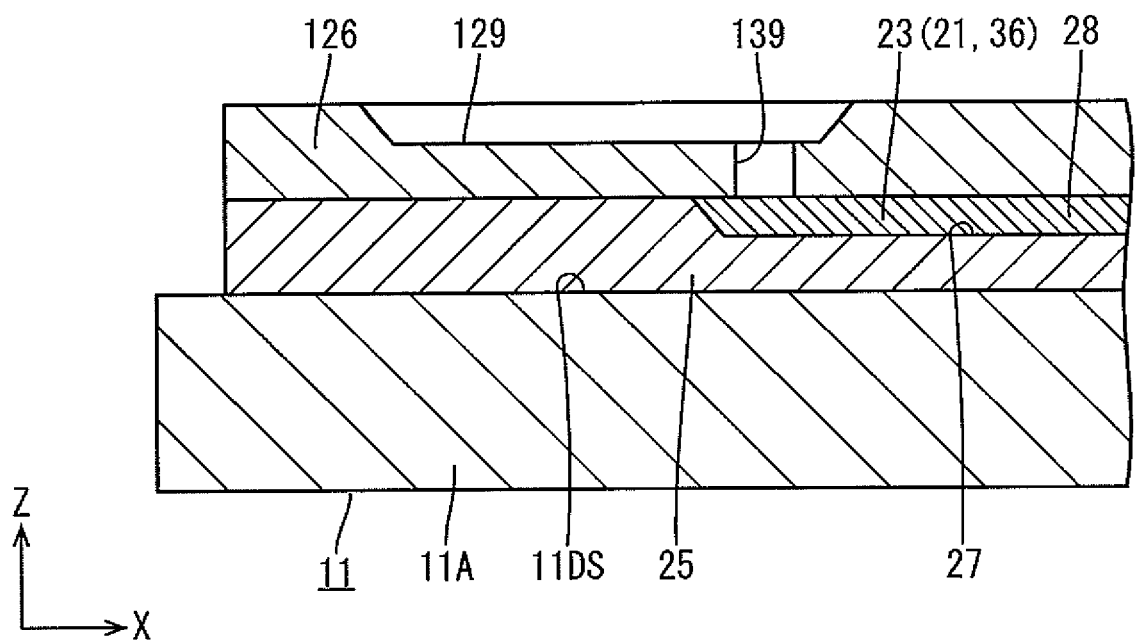
FIG. 16 is a cross-sectional view showing a state where a contact hole has been formed in the second imprint layer in a contact hole forming step of the method for manufacturing a touch panel.

A second embodiment is described with reference to FIGS. 15A to 16. The second embodiment illustrates changes made to achieve a method for manufacturing a touch panel. It should be noted that a repeated description of structures, actions, and effects which are similar to those of the first embodiment is omitted.

In the method for manufacturing a touch panel according to the second embodiment, a contact hole 139 is bored through a second imprint layer 126 by so-called wet etching. Specifically, in a second imprint layer forming step of the method for manufacturing a touch panel, a second imprint layer 126 made of an ultraviolet-curable resin material 126M, which is a negative-type photosensitive resin material, is formed. In a second groove forming step that follows, as shown in FIG. 15A, a second imprint block 142 is used which has a light shield 44 selectively placed in a portion thereof that overlaps a place where a contact hole 139 is to be formed. With the second imprint block 142 pressed onto a surface of the ultraviolet-curable resin material 126M in an uncured state, ultraviolet rays with which to cure the ultraviolet-curable resin material 126M are applied at low intensities (e.g. several mW/cm$^2$, approximately 100 mJ/cm$^2$). Then, a large portion of the ultraviolet-curable resin material 126M that does not overlap the light shield 44 of the second imprint block 142 is brought into a semicured state by being irradiated with low-intensity ultraviolet rays, and a portion of the ultraviolet-curable resin material 126M that overlaps the light shield 44 (place where a contact hole 139 is to be formed) is selectively kept uncured by being shielded from (unirradiated with) ultraviolet rays by the light shield 44. It should be noted that FIG. 15A uses arrows to indicate ultraviolet rays. Upon completion of the irradiation with ultraviolet rays, as shown in FIG. 15B, the second imprint block 142 is removed from the second imprint layer 126. Then, a second protrusion 142A or the like on the second imprint block 142 is transferred into the second imprint layer 126, so that a second groove 129 is formed. After that, in a contact hole forming step, wet etching is performed with an etchant such as IPA (isopropyl alcohol), whereby as shown in FIG. 16, an uncured portion of the second imprint layer 126 is selectively removed, so that a contact hole 139 is bored. After that, the second imprint layer 126 is irradiated with ultraviolet rays at high intensities (50 to 100 mW/cm$^2$, approximately 1000 to 2000 mJ/cm$^2$), whereby the second imprint layer 126, which has been in a semicured state, is completely cured.

According to the second embodiment, as described above, in the second imprint layer forming step, the second imprint layer 126 made of a ultraviolet-curable resin material 126M, which is a photosensitive resin material, is formed, in the second groove forming step, a place in the second imprint layer 126 where the contact hole 139 is to be formed is selectively exposed to light or shielded from light so that the place is selectively left uncured, and in the contact hole forming step, the place is selectively removed by etching. In this way, in a case where the ultraviolet-curable resin material 126M, which is a photosensitive resin material, is of a negative type, the place in the second imprint layer 126 where the contact hole 139 is to be formed is selectively shielded from light in the second groove forming step, whereby the place is selectively left uncured. In the contact hole forming step, the place is selectively removed by etching, whereby the contact hole 139 can be bored.

Other Embodiments

The technology described herein is not limited to the embodiments described above with reference to the drawings. The following embodiments may be included in the technical scope.

(1) Alternatively, it may be configured such that the whole area of the first touch electrode and a part of the first peripheral wire constitute the first non-terminal side conductive part and the remaining portion of the first peripheral wire and the first terminal constitute the first terminal side conductive part. In this case, it is configured such that the contact hole is bored through a place in the second imprint layer where apart of the first peripheral wire constituted by the first conductive layer and the remaining portion of the first peripheral wire constituted by the second conductive layer overlap each other.

(2) Besides (1) described above, it may be configured such that the first touch electrode and the first peripheral wire constitute the first non-terminal side conductive part and the first terminal constitutes the first terminal side conductive part. In this case, it is configured such that the contact hole is bored through a place in the second imprint layer where the first peripheral wire constituted by the first conductive layer and the first terminal constituted by the second conductive layer overlap each other.

(3) In a case where the configuration (1) or (2) is adopted, the planar placement of the contact hole may be set anywhere in a path of routing of the first peripheral wire. For example, the contact hole may be placed in a portion of the first peripheral wire that extends along the Y-axis direction, in a portion of the first peripheral wire that extends along an oblique direction, or at an end of the first peripheral wire that faces the first terminal (i.e. a place in the first peripheral wire that overlaps the first terminal).

(4) Alternatively, it is also possible to adopt a manufacturing method in which the second imprint layer forming step includes the contact hole forming step. In that case, in the second imprint layer forming step, for example, the second imprint layer is formed by an inkjet printing method or a screen printing method. The inkjet printing method or the screen printing method makes it possible to control, for example, the range of application of the ultraviolet-curable resin material of the second imprint layer with a high degree of accuracy and therefore makes it possible to bore a contact hole to which the ultraviolet-curable resin material is locally not applied.

(5) Alternatively, it is also possible to adopt a configuration in which the first terminal (first terminal side conductive part) and the second terminal (second terminal side conductive part) are both constituted by the first conductive layer. In that case, it is only necessary to selectively notch a portion of the second imprint layer that overlaps the first terminal and the second terminal.

(6) Alternatively, the contact hole may have such a depth as to penetrate through the first conductive layer but not to reach the first imprint layer, such a depth as to remove only the surface-layer side of the first conductive layer, or such a depth as to penetrate through the second imprint layer but not to reach the first conductive layer.

(7) Alternatively, it is also possible to use another type of laser irradiator, provided it effects laser ablation.

(8) Alternatively, the second imprint layer may be made of a positive-type ultraviolet-curable resin material. In that case, a light shield is formed in a portion of the second imprint block for use in the second groove forming step that does not overlap the place where the contact hole is to be formed, and no light shield is formed in a portion of the second imprint block that overlaps the place where the contact hole is to be formed. When the second groove forming step is performed by using the second imprint block, the place in the second imprint layer where the contact hole is to be formed is selectively exposed to light, whereby the place where the contact hole is to be formed can be selectively left uncured.

(9) Alternatively, it is also possible to bore the contact hole by performing dry etching.

(10) Alternatively, the object to be connected via the contact hole may be changed as appropriate to be other than the touch panel pattern.

(11) Besides the embodiments described above, specific numerical values such as the thickness of each imprint layer, the thickness of the organic EL panel, and the thickness of the polarizing plate are subject to change as appropriate. Similarly, specific numerical values such as the depth and line width of each conductive layer are subject to change as appropriate. Similarly, a specific numerical value of an outer dimension of each touch electrode is subject to change as appropriate.

(12) Alternatively, it is also possible to apply the technology described herein, for example, by using, as the "wiring board" instead of the touch panel, a shielding component for shielding electromagnetic waves from the organic EL panel. Such a shielding component is formed, for example, by routing a conductive layer in a mesh pattern in a manner similar to each of the embodiments described above on a surface of a single-layer imprint layer, and has both translucency and shielding performance. Other than those above, the specific configuration of the shielding component is subject to change as appropriate.

(13) Alternatively, the first conductive layer and the second conductive layer may be laminated structures each formed by joining multiple layers on top of each other. For example, the first conductive layer and the second conductive layer may be laminated structures in each of which a metal layer made of a metal material is placed on a lower level (deeper level) and a light-absorbing conductive layer made of a conductive material that is higher in optical absorptance than the metal layer is placed on an upper level (surface-layer level), and this makes it possible to achieve superior electrical conductivity and enable the light-absorbing conductive layer to provide an outside light reflection suppression function. It should be noted that the specific laminated structures of the first conductive layer and the second conductive layer are not limited to these but are subject to change as appropriate.

(14) Alternatively, it is possible to use gold nanoink, copper nanoink, conductive paste such as silver paste, black fullerene ink, carbon ink, carbon-based material ink, or the like. Furthermore, it is also possible to use hybrid ink prepared by mixing fullerene ink, carbon ink, or carbon-based material ink into metal nanoink.

(15) Alternatively, the first imprint layer and the second imprint layer may be made of different materials. Even in that case, it is preferable that the materials be identical in property (such as ultraviolet curability) to each other and the materials be different in specific name and composition from each other. However, this is not intended to impose any limitation.

(16) Alternatively, the first imprint layer and the second imprint layer may be each made of a visible-light-curable resin material (which is a type of photo-curable resin material that is cured by irradiation with visible light), a thermosetting resin material, a thermoplastic resin material, or the like.

(17) Besides the embodiments described above, it is of course possible to swap the direction of arrangement of first touch electrodes and the direction of arrangement of second touch electrodes.

(18) Alternatively, the planar shape of each of the touch electrodes may be changed as appropriate to a square shape, a circular shape, a polygonal shape with five or more angles, or the like.

(19) Alternatively, the technology described herein is also applicable to a touch panel pattern of a self-capacitance type.

(20) Alternatively, the planar shape of the organic EL display device may be a vertically long square shape or a regular square shape or may be a non-square shape such as a circular shape or an elliptical trapezoidal shape. Further, the planar shape of the organic EL display device may be a substantially square shape with at least one rounded corner.

(21) Alternatively, the base material of the organic EL panel may be made of glass.

(22) Alternatively, the touch panel may be provided integrally with a device (e.g. a touch pad) other than the display device.

(23) This may be replaced by a liquid crystal display device including a liquid crystal panel as a display panel. Furthermore, the organic EL display device and the liquid crystal display device may be replaced by a quantum-dot display device including a quantum-dot panel as a display panel. The quantum-dot panel utilizes, as a light-emitting layer such as an organic EL layer, a quantum-dot layer composed of quantum dots. It is preferable that the quantum-dot layer be composed, for example, of blue quantum dots that emit blue light, green quantum dots that emit green light, and red quantum dots that emit red light.

The invention claimed is:

1. A wiring board comprising:
   a first imprint layer having a first groove formed by partially depressing a surface of the first imprint layer;
   a first conductive layer formed in the first groove;
   a second imprint layer stacked on the first imprint layer, the second imprint layer having a second groove formed by partially depressing a surface of the second imprint layer and a contact hole that communicates with at least a part of the second groove;
   a second conductive layer formed in the second groove and the contact hole;
   a first terminal side conductive part constituted by the second conductive layer and including a first terminal to which an external component is connected, the first terminal side conductive part being disposed to at least partially overlap the contact hole;
   a first non-terminal side conductive part that is constituted by the first conductive layer and does not include the first terminal, the first non-terminal side conductive part being disposed to at least partially overlap the contact hole;
   a second terminal side conductive part constituted by the second conductive layer and including a second terminal to which the external component is connected; and
   a second non-terminal side conductive part that is constituted by the second conductive layer and does not include the second terminal, the second non-terminal side conductive part being joined to the second terminal side conductive part.

2. The wiring board according to claim 1, wherein the second imprint layer is disposed to overlap a surface of the first imprint layer in which the first groove is formed.

3. The wiring board according to claim 1, wherein at least parts of the first non-terminal side conductive part and the second non-terminal side conductive part include a first position detecting electrode and a second position detecting electrode, respectively, that form capacitances with a position inputter inputting a position and detect a position inputted by the position inputter, and the first position detecting electrode and the second position detecting electrode do not overlap each other.

4. The wiring board according to claim 3, further comprising:
   a position detecting region where the first position detecting electrode and the second position detecting electrode are disposed; and
   a non-position detecting region where at least the first terminal and the second terminal are disposed and the first position detecting electrode and the second position detecting electrode are not disposed,
   wherein the first terminal side conductive part and the second terminal side conductive part are disposed in the non-position detecting region and include a first peripheral wire and a second peripheral wire that connect the first position detecting electrode and the second position detecting electrode to the first terminal and the second terminal, respectively.

5. A display device comprising:
    the wiring board according to claim 1; and
    a display panel on a surface of which the wiring board is placed.

6. The display device according to claim 5, wherein the first imprint layer is made of an ultraviolet-curable resin material.

7. The display device according to claim 6, wherein the display panel is made of synthetic resin and has flexibility.

8. A method for manufacturing a wiring board, the method comprising:
    a first imprint layer forming step of forming a first imprint layer;
    a first groove forming step of forming a first groove by partially depressing a surface of the first imprint layer;
    a first conductive layer forming step of forming, in the first groove, a first conductive layer that constitutes a first non-terminal side conductive part without including a first terminal that is connected to an external component;
    a second imprint layer forming step of forming a second imprint layer in such a manner that the second imprint layer overlaps the first imprint layer;
    a second groove forming step of forming a second groove by partially depressing a surface of the second imprint layer;
    a contact hole forming step of boring a contact hole through a location in the second imprint layer that overlaps a part of the second groove and at least a part of the first non-terminal side conductive part; and
    a second conductive layer forming step of forming, in the second groove and the contact hole, a first terminal side conductive part that includes the first terminal and is disposed to at least partially overlap the contact hole, a second terminal side conductive part including a second terminal that is connected to the external component, and a second non-terminal side conductive part that does not include the second terminal.

9. The method for manufacturing a wiring board according to claim 8, wherein in the contact hole forming step, the contact hole is bored through the second imprint layer by laser ablation.

10. The method for manufacturing a wiring board according to claim 8, wherein in the second imprint layer forming step, the second imprint layer made of a photosensitive resin material is formed,
    in the second groove forming step, a place in the second imprint layer where the contact hole is to be formed is selectively exposed to light or shielded from light so that the place is selectively left uncured, and
    in the contact hole forming step, the place is selectively removed by etching.

* * * * *